US009892955B2

(12) United States Patent
Kaba et al.

(10) Patent No.: US 9,892,955 B2
(45) Date of Patent: *Feb. 13, 2018

(54) SUBSTRATE HOLDING/ROTATING DEVICE, SUBSTRATE PROCESSING APPARATUS INCLUDING THE SAME, AND SUBSTRATE PROCESSING METHOD

(71) Applicant: SCREEN Holdings Co., Ltd., Kyoto (JP)

(72) Inventors: Hiromichi Kaba, Kyoto (JP); Akihiko Taki, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/271,642

(22) Filed: Sep. 21, 2016

(65) Prior Publication Data

US 2017/0092530 A1    Mar. 30, 2017

(30) Foreign Application Priority Data

Sep. 29, 2015 (JP) ................................. 2015-192154
Feb. 19, 2016 (JP) ................................. 2016-030155

(51) Int. Cl.
  *H01L 21/67* (2006.01)
  *H01L 21/68* (2006.01)
  (Continued)

(52) U.S. Cl.
  CPC .......... *H01L 21/68785* (2013.01); *B08B 3/10* (2013.01); *H01L 21/67051* (2013.01); *H01L 21/68728* (2013.01); *H01L 21/68792* (2013.01)

(58) Field of Classification Search
  CPC ......... H01L 21/68721; H01L 21/68764; H01L 21/67023; H01L 21/68714;
  (Continued)

(56) References Cited

U.S. PATENT DOCUMENTS

2011/0253181 A1   10/2011   Obweger et al. ............. 134/157
2011/0304107 A1   12/2011   Obweger et al. ............... 279/60
(Continued)

FOREIGN PATENT DOCUMENTS

JP        2009-290038        12/2009
JP        2014-212338        11/2014
(Continued)

*Primary Examiner* — Caleen Sullivan
(74) *Attorney, Agent, or Firm* — Ostrolenk Faber LLP

(57) ABSTRACT

This substrate holding/rotating device includes an opening magnet forming a predetermined magnetic field generation region through which each movable pin rotating in response to rotation of the rotary table is capable of passing, the magnetic field generation region disposed so as to be eccentric with respect to a rotation direction of the rotary table and so as to allow only driving magnets corresponding to part of the plurality of movable pins to pass through the magnetic field generation region, the opening magnet giving a repulsive force or an attractive force to the driving magnet of the movable pin passing through the magnetic field generation region, the opening magnet generating a force that enables the support portion of the movable pin urged to the hold position by the urging unit to move toward the open position against an urging force of the urging unit.

14 Claims, 21 Drawing Sheets

(51) Int. Cl.
   *B08B 3/10* (2006.01)
   *H01L 21/687* (2006.01)
(58) Field of Classification Search
   CPC ........... H01L 21/68785; H01L 21/6875; H01L 21/67051; H01L 21/68728; H01L 21/67028; H01L 21/68792; B08B 11/02
   USPC ..................................................... 134/21, 33
   See application file for complete search history.

(56) References Cited

U.S. PATENT DOCUMENTS

| | | |
|---|---|---|
| 2013/0152971 A1 | 6/2013 | Kato .............................. 134/21 |
| 2015/0279721 A1 | 10/2015 | Kikumoto et al. |
| 2016/0096205 A1 | 4/2016 | Kato |
| 2017/0092532 A1* | 3/2017 | Kaba ................. H01L 21/67051 |

FOREIGN PATENT DOCUMENTS

| | | |
|---|---|---|
| JP | 2015-002328 | 1/2015 |
| JP | 2015-188008 | 10/2015 |
| JP | 2016-046360 | 4/2016 |

* cited by examiner

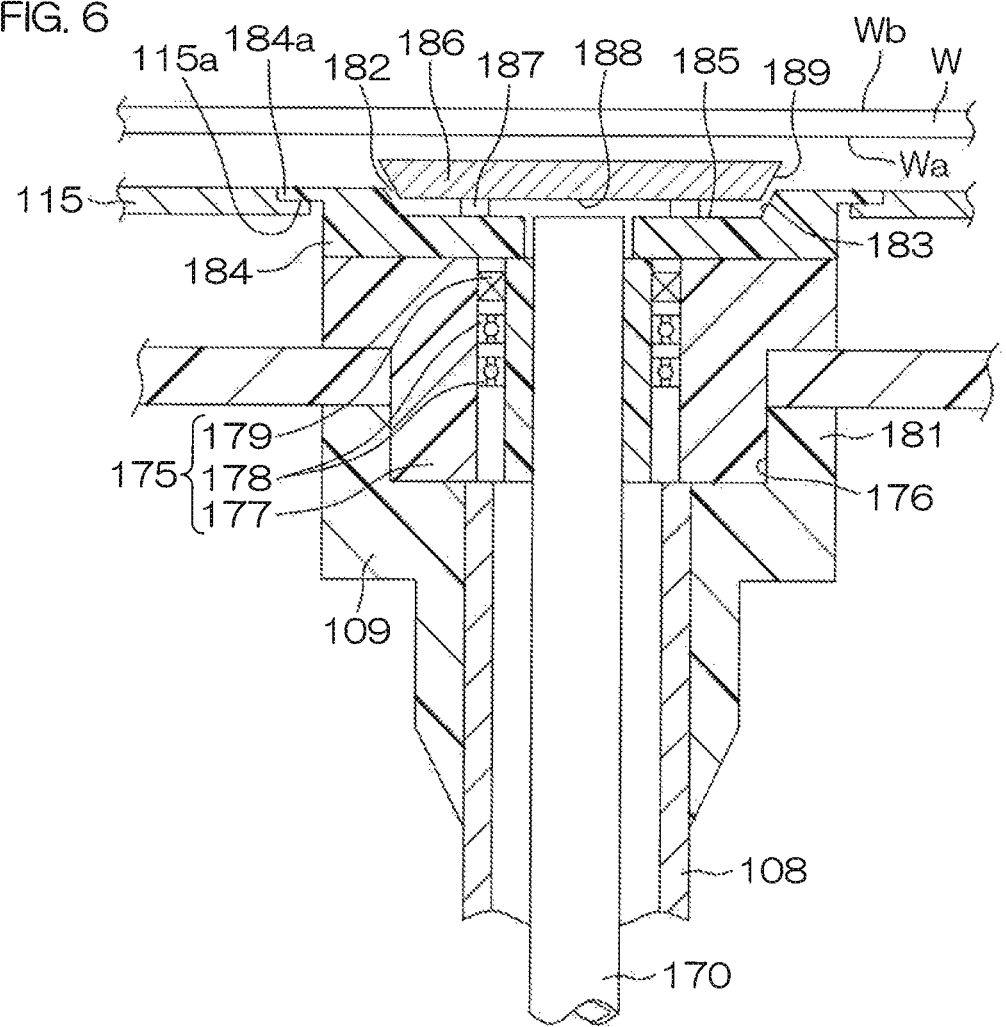

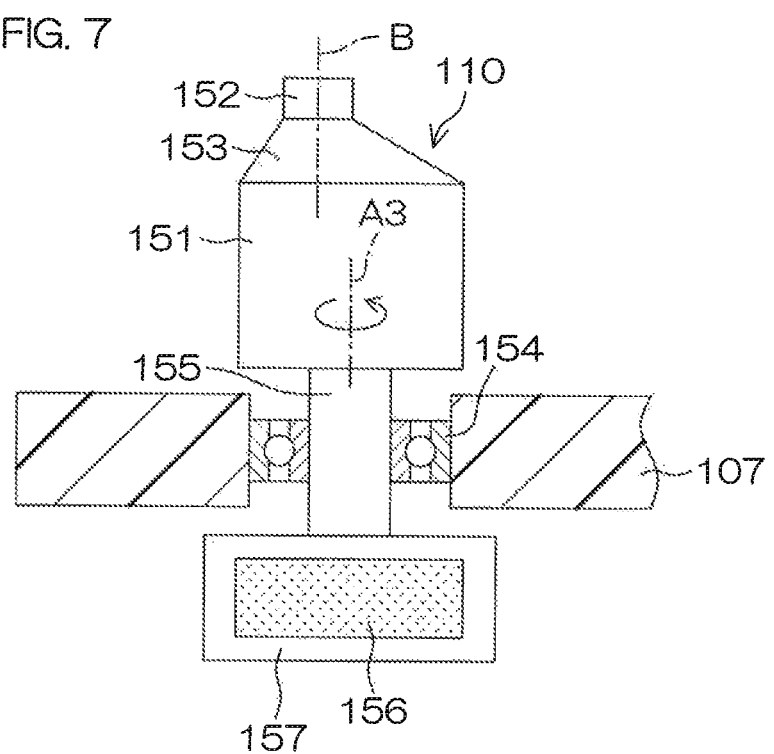

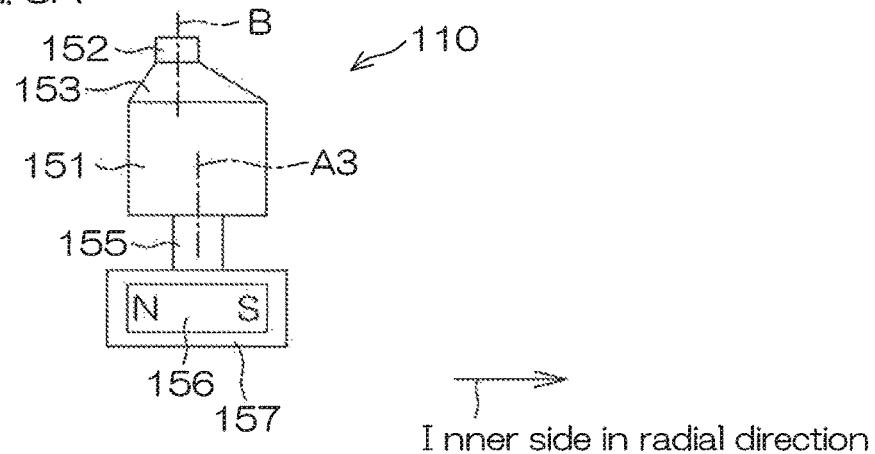
FIG. 8A
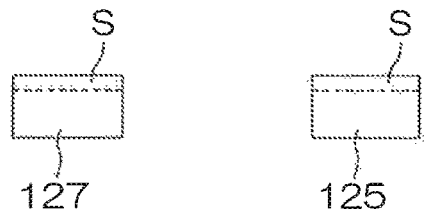
Inner side in radial direction
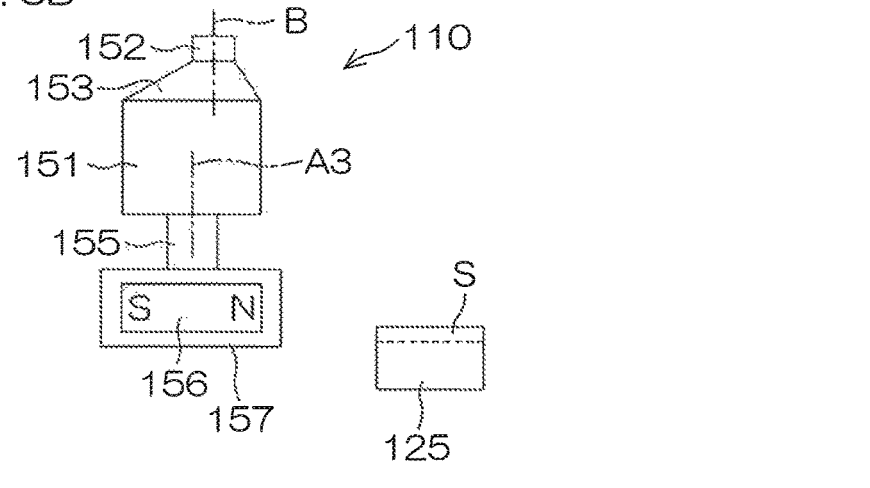
FIG. 8B
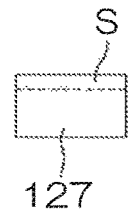
Inner side in radial direction

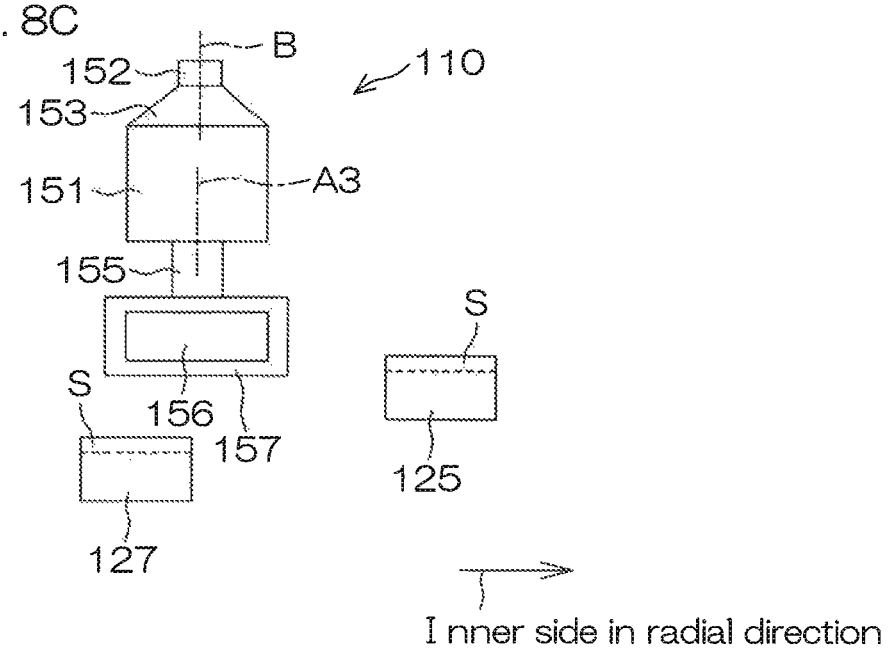

SUBSTRATE HOLDING/ROTATING DEVICE, SUBSTRATE PROCESSING APPARATUS INCLUDING THE SAME, AND SUBSTRATE PROCESSING METHOD

BACKGROUND OF THE INVENTION

1. Field of the Invention

The present invention relates to a substrate holding/rotating device, a substrate processing apparatus including the same, and a substrate processing method. Examples of substrates to be held or substrates to be processed include semiconductor wafers, substrate for liquid crystal display devices, substrate for plasma displays, substrates for FEDs (field emission displays), substrates for optical disks, substrates for magnetic disks, substrates for magnet-optical disks, substrates for photomasks, ceramic substrates, substrates for solar cells.

2. Description of Related Art

US2013/0152971 A1 discloses a rotating type substrate holding/rotating device that is composed of a rotary table that is rotatable around a rotational axis along a vertical direction, a rotation driving unit that rotates the rotary table around the rotational axis, and a plurality of (e.g., four) holding pins that are disposed at the rotary table and that horizontally position a substrate with a predetermined interval between the substrate and the surface of the rotary table.

The plurality of holding pins include fixed pins that are immovable with respect to the rotary table and movable pins that are movable with respect to the rotary table. The movable pin is rotatably disposed around the rotational axis that is coaxial with its central axis, and has a contact portion that is brought into contact with the peripheral end edge of the substrate. The contact portion is displaced by the rotation of the contact portion between an open position that is far apart from the rotational axis and a hold position that is close to the rotational axis. A pin driving magnet is joined to a rotational shaft of the contact portion.

Switching between the opening and the closing of the movable pin is performed by use of an elevated/lowered magnet disposed below the rotary table (magnet switching method). A magnet raising-and-lowering unit is joined to the elevated/lowered magnet. When the elevated/lowered magnet is at a predetermined lower position, the elevated/lowered magnet does not face the pin driving magnet, and therefore an external force that urges a movable pin toward its hold position does not act on this movable pin. Therefore, when the elevated/lowered magnet is at the lower position, the movable pin is held at its open position. On the other hand, when the elevated/lowered magnet is at a predetermined upper position, the movable pin is held at its hold position by means of a magnetic attractive force between the elevated/lowered magnet and the pin driving magnet.

The substrate holding/rotating device mentioned above is included in a single substrate processing type apparatus that processes substrates one at a time, and a processing liquid (a cleaning chemical liquid) is supplied from a processing liquid nozzle to the upper surface of a substrate being rotated by the substrate holding/rotating device. The processing liquid supplied to the upper surface of the substrate receives a centrifugal force resulting from the rotation of the substrate, and flows toward the peripheral edge part of the substrate. As a result, the whole area of the upper surface of the substrate and the peripheral end surface of the substrate are subjected to liquid treatment. Additionally, depending on the kind of substrate processing, there is also a case in which the peripheral edge part of the undersurface of the substrate is also intended to be subjected to liquid processing.

SUMMARY OF THE INVENTION

However, in the arrangement described in US2013/0152971 A1, the substrate is supported by the plurality of (for example, four) holding pins in a state in which the substrate is in contact with the holding pins from beginning to end during liquid processing, and therefore, at contact positions of the holding pins in the peripheral end surface of the substrate, there is a fear that the processing liquid will not flow around, and the unfinished remainder of cleaning will occur at the peripheral edge part of the substrate (i.e., the peripheral end surface of the substrate and the peripheral edge part of the undersurface of the substrate). Although the peripheral edge part of the substrate is able to be washed without the unfinished remainder of cleaning if the contact support position of the substrate is changed while the substrate is being rotated, only some of the holding pins disposed at the rotary table being rotating are required to be selectively opened during the processing of the substrate in order to realize such a change in the contact support position. However, in the substrate holding/rotating device according to the magnet switching method described in the aforementioned patent document 1, the elevated/lowered magnet by which switching between the opening and the closing of the movable pin is performed is disposed so as to be nonrotational, and therefore it is impossible to selectively open only some of the holding pins disposed at the rotary table being rotating. If the elevated/lowered magnet is disposed at the lower position while the rotary table is rotating in the aforementioned patent document 1 and if two movable pins are both brought into an open state, there is a fear that the substrate will separate from the rotating rotary table.

Therefore, an object of the present invention is to provide a substrate holding/rotating device employing a magnet switching method that is capable of excellently supporting and rotating a substrate and that is capable of changing a contact support position of the substrate by means of a movable pin while the substrate is rotating.

Another object of the present invention is to provide a substrate processing apparatus and a substrate processing method that are capable of excellently processing the peripheral edge part of a substrate without the unfinished remainder of processing.

The present invention provides a substrate holding/rotating device that includes a rotary table, a rotation driving unit that rotates the rotary table around a rotational axis in a vertical direction, a plurality of movable pins each of which horizontally supports a substrate, the movable pin having a support portion disposed so as to be movable between an open position that is far apart from the rotational axis and a hold position that has approached the rotational axis, the movable pin disposed so as to rotate around the rotational axis together with the rotary table, an urging unit that urges the support portion of each movable pin to the hold position, driving magnets attached correspondingly to each movable pin, and an opening magnet disposed in a non-rotational state, the opening magnet forming a predetermined magnetic field generation region through which each movable pin rotating in response to rotation of the rotary table is capable of passing, the magnetic field generation region disposed so as to be eccentric with respect to a rotation direction of the rotary table and so as to allow only driving magnets corresponding to part of the plurality of movable pins to pass through the magnetic field generation region, the opening magnet giving a repulsive force or an attractive force to the driving magnet of the movable pin passing through the magnetic field generation region, and the opening magnet generating a force that enables the support portion of the movable pin urged to the hold position by means of the urging unit to move toward the open position against an urging force of the urging unit.

According to this arrangement, the plurality of movable pins are disposed at the rotary table, and each movable pin has the support portion disposed movably between the open position and the hold position. The support portion of each movable pin is urged to the hold position by means of the urging unit.

In the substrate holding/rotating device, the opening magnet is disposed in a non-rotational state. The opening magnet allows only driving magnets corresponding to movable pins, among the plurality of movable pins rotating in response to the rotation of the rotary table, that pass through a magnetic field generation region disposed so as to be eccentric with respect to the rotation direction of the rotary table to generate a repulsive force, and yet the opening magnet does not give a repulsive force or an attractive force to driving magnets corresponding to movable pins that do not pass through the magnetic field generation region. This magnetic field generation region is disposed so that only driving magnets corresponding to part of the plurality of movable pins can pass through the magnetic field generation region.

A force that compels the support portion of the movable pin to go to the open position against the urging force is generated in the movable pin (movable pin passing through the magnetic field generation region) to which a repulsive force or an attractive force is given by the opening magnet. This makes it possible to weaken the pressing force of the movable pin against the peripheral edge part of the substrate. If the force that is generated in the support portion of the movable pin and that compels it to go to the open position exceeds a repulsive force or an attractive force larger than an urging force from the urging unit at this time, a gap is formed between the peripheral edge part of the substrate and the support portion of the movable pin, and, as a result, the support portion will not support the substrate. Additionally, in response to a change in phase of each movable pin resulting from the rotation of the rotary table, the movable pins passing through the magnetic field generation region successively change places with each other. This makes it possible to change the contact support position of the substrate by the movable pin in response to the rotation of the rotary table. It is possible to change the contact support position of the substrate.

On the other hand, the movable pin to which a repulsive force and an attractive force are not given by the opening magnet (the movable pin not passing through the magnetic field generation region) is held in a state in which its support portion remains at the open position. This makes it possible to support the peripheral edge part of the substrate by the movable pin. As a result, it is possible to excellently support and rotate the substrate.

Therefore, it is possible to provide a substrate holding/rotating device employing a magnet switching method that is capable of excellently supporting and rotating a substrate and that is capable of changing a contact support position of the substrate by a movable pin while the substrate is rotating.

In one preferred embodiment of the present invention, the substrate holding/rotating device further includes a first relative movement unit that relatively moves the opening magnet and the rotary table so as to change a distance between the opening magnet and the driving magnet.

According to this arrangement, it is possible to change a distance between the opening magnet and the driving magnet by allowing the first relative movement unit to relatively move the opening magnet and the rotary table. Therefore, by relatively moving the opening magnet and the rotary table, it is possible to perform switching between a state in which a magnetic field generation region is generated in a region through which each driving magnet passes and a state in which a magnetic field generation region is not generated in a region through which each driving magnet passes.

The first relative movement unit may relatively move the opening magnet and the rotary table between a first position in which the magnetic field generation region is formed in a region through which each driving magnet passes and a second position in which the magnetic field generation region is not formed in a region through which each driving magnet passes.

According to this arrangement, in a state in which relative positions of the opening magnet and the rotary table are at the first position, it is possible to give a repulsive force or an attractive force to the movable pin passing through the magnetic field generation region from the opening magnet, and it is possible to change the contact support position of the substrate by the movable pin while the substrate is rotating. On the other hand, in a state in which relative positions of the opening magnet and the rotary table are at the second position, it is impossible to change the contact support position of the substrate by the movable pin while the substrate is rotating because the magnetic field generation region is not generated in a region through which each driving magnet passes.

The support portion of the movable pin may be disposed at an intermediate position between the open position and the hold position in a state in which the opening magnet and the rotary table are at the first position.

According to this arrangement, in a state in which relative positions of the opening magnet and the rotary table are at the first position, a repulsive force or an attractive force larger than an urging force given by the urging unit is given to the movable pin passing through the magnetic field generation region. As a result, the support portion of the movable pin is disposed at the intermediate position between the open position and the hold position.

The urging unit may include a closing magnet that gives a repulsive force or an attractive force to a space between the closing magnet and each driving magnet and that urges the support portion of each movable pin to the hold position.

According to this arrangement, the support portion of each movable pin is urged to the hold position by means of the closing magnet. This makes it possible to easily realize a arrangement to urge the support portion of each movable pin to the hold position.

The substrate holding/rotating device may further include a second relative movement unit that relatively moves the closing magnet and the rotary table between a third position in which the closing magnet gives the repulsive force or the attractive force to a space between the closing magnet and the driving magnet and a fourth position in which the closing magnet does not give the repulsive force and the attractive force to a space between the closing magnet and the driving magnet.

According to this arrangement, by allowing the relative positions of the closing magnet and the rotary table to be switched between the third position and the fourth position, it is possible to perform switching between a state in which the support portion of each movable pin is urged to the hold position and a state in which the support portion of each movable pin is not urged to the hold position.

The opening magnets may include a plurality of opening magnets spaced out in a circumferential direction of the rotary table, and the magnetic field generation region formed in a region through which each driving magnet passes may be an intermittent region in the rotation direction of the rotary table.

According to this arrangement, it is possible to form the magnetic field generation region so as to be an intermittent region in the rotation direction of the rotary table, and therefore it is possible to simultaneously exert a repulsive force or an attractive force from the opening magnet on movable pins that do not adjoin each other among a plurality of movable pins disposed at the peripheral edge part of a substrate. This makes it possible to simultaneously bring the movable pins that do not adjoin each other into a non-support state, i.e., this makes it possible to support the substrate by means of the remaining movable pins, and therefore it is possible to more stably support and rotate the substrate when some movable pins release the support of the substrate.

The movable pins may include a first movable pin group including at least three movable pins and a second movable pin group that is disposed independently of the first movable pin group and that includes at least three movable pins, and the driving magnets provided correspondingly to all the movable pins may be disposed to have mutually-identical polar directions with respect to a direction perpendicular to an axis along the rotational axis, and the opening magnets may be disposed so that each driving magnet corresponding to the second movable pin group is not present in the magnetic field generation region in a state in which each driving magnet corresponding to the first movable pin group is present in the magnetic field generation region, and may be disposed so that each driving magnet corresponding to the first movable pin group is not present in the magnetic field generation region in a state in which each driving magnet corresponding to the second movable pin group is present in the magnetic field generation region.

According to this arrangement, each second movable pin group does not participate in supporting the substrate when each first movable pin group comes in contact with and supports the peripheral edge part of a substrate. Likewise, each first movable pin group does not participate in supporting the substrate when each second movable pin group comes in contact with and supports the peripheral edge part of a substrate. Therefore, in response to a change in phase of each movable pin resulting from the rotation of the rotary table, a transition is made between a state in which the substrate is supported by the first movable pin group including three or more movable pins and a state in which the substrate is supported by the second movable pin group including three or more movable pins. In other words, whenever the rotary table makes one rotation, the substrate is shifted between the first movable pin group and the second movable pin group a plurality of times.

The first movable pin group may include the movable pins equal in number to the second movable pin group, and the first movable pin group and the second movable pin group may be disposed so that the first and second movable pin groups become alternate with respect to a circumferential direction of the rotary table and so that the movable pins included in each movable pin group are evenly spaced out, and the opening magnets that are equal in number to the movable pins included in each movable pin group may be evenly spaced out in the circumferential direction of the rotary table.

According to this arrangement, the first and second movable pin groups are arranged to become alternate with respect to the circumferential direction of the rotary table, and the movable pins included in each movable pin group are evenly spaced out, and therefore it is possible to excellently support the substrate by means of each movable pin group both in a state in which the substrate is supported by the first movable pin group including three or more movable pins and in a state in which the substrate is supported by the second movable pin group including three or more movable pins.

Additionally, the plurality of opening magnets that are equal in number to the movable pins included in each movable pin group are evenly spaced out in the circumferential direction of the rotary table, and therefore it is possible to form the magnetic field generation region formed by the plurality of opening magnets into such a shape as to allow driving magnets corresponding to movable pins included in each movable pin group to simultaneously pass through the magnetic field generation region.

A rotation speed of the rotary table and/or a length in a circumferential direction of the opening magnet may be provided so that the magnetic field generation region formed by the single opening magnet coincides with a disposition interval in the circumferential direction between the movable pins with respect to the circumferential direction of the rotary table.

According to this arrangement, the magnetic field generation region formed by the single opening magnet coincides with a disposition interval in the circumferential direction between the movable pins with respect to the circumferential direction of the rotary table, and therefore it is possible to switch the states of the plurality of movable pins disposed at the rotary table one by one.

The substrate holding/rotating device may further include a shielding member that shields interference between a magnetic field generated by the opening magnet and a magnetic field generated by the closing magnet.

According to this arrangement, it is possible to reliably prevent interference between a magnetic field generated by the opening magnet and a magnetic field generated by the closing magnet.

The present invention additionally provides a substrate processing apparatus that includes the substrate holding/rotating device and a processing liquid supplying unit that supplies a processing liquid to a major surface of a substrate held by the substrate holding/rotating device.

According to this arrangement, a processing liquid is supplied from the processing liquid supplying unit to the major surface of the substrate. The processing liquid supplied to the major surface of the substrate receives a centrifugal force resulting from the rotation of the substrate, and flows toward the peripheral edge part of the substrate. As a result, the peripheral edge part of the substrate is subjected to liquid processing by means of the processing liquid. In the present invention, it is possible to change the contact support position of the substrate by the movable pin while the substrate is rotating. Therefore, it is possible to excellently process the peripheral edge part of the substrate without the unfinished remainder of processing.

The substrate processing apparatus may further include a first relative movement unit that relatively moves the opening magnet and the rotary table between a first position in which the magnetic field generation region is formed in a region through which each driving magnet passes and a second position in which the magnetic field generation region is not formed in the region through which each driving magnet passes and a controller that controls the rotation driving unit, the processing liquid supplying unit, and the first relative movement unit. In this case, the controller may execute a rotary table rotation step of rotating the rotary table around the rotational axis, a processing liquid supply step of supplying a processing liquid to a substrate rotating in response to rotation of the rotary table, and an opening magnet disposing step of disposing relative positions of the opening magnet and the rotary table at the first position in parallel with the rotary table rotation step and with the processing liquid supply step.

According to this arrangement, a processing liquid is supplied to the major surface of the substrate being rotating. The processing liquid supplied to the major surface of the substrate receives a centrifugal force resulting from the rotation of the substrate, and flows toward the peripheral edge part of the substrate. As a result, the peripheral edge part of the substrate is subjected to liquid processing by means of the processing liquid.

Furthermore, in parallel with the rotation of the rotary table and with the supply of the processing liquid, relative positions of the opening magnet and the rotary table are placed at the first position in which the magnetic field generation region is formed in a region through which each driving magnet passes. In this case, it is possible to change the contact support position of the substrate by the movable pin in response to a change in phase of the rotation of the rotary table. Therefore, it is possible to supply the processing liquid to the whole area of the peripheral edge part of the substrate, and hence is possible to excellently process the peripheral edge part of the substrate thereby without the unfinished remainder of processing.

The present invention additionally provides a substrate processing method executed in a substrate processing apparatus, the substrate processing apparatus including a substrate holding/rotating device and a first relative movement unit, the substrate holding/rotating device including a rotary table, a rotation driving unit that rotates the rotary table around a rotational axis in a vertical direction, a plurality of movable pins each of which horizontally supports a substrate, the movable pin having a support portion disposed so as to be movable between an open position that is far apart from the rotational axis and a hold position that has approached the rotational axis, the movable pin disposed so as to rotate around the rotational axis together with the rotary table, an urging unit that urges the support portion of each movable pin to the hold position, driving magnets attached correspondingly to each movable pin, and an opening magnet disposed in a non-rotational state, the opening magnet forming a predetermined magnetic field generation region through which each movable pin rotating in response to rotation of the rotary table is capable of passing, the magnetic field generation region disposed so as to be eccentric with respect to a rotation direction of the rotary table and so as to allow only driving magnets corresponding to part of the plurality of movable pins to pass through the magnetic field generation region, the opening magnet giving a repulsive force or an attractive force to the driving magnet of the movable pin passing through the magnetic field generation region, the opening magnet generating a force that enables the support portion of the movable pin urged to the hold position by means of the urging unit to move toward the open position against an urging force of the urging unit, and the first relative movement unit relatively moving the opening magnet and the rotary table between a first position in which the magnetic field generation region is formed in a region through which each driving magnet passes and a second position in which the magnetic field generation region is not formed in a region through which each driving magnet passes, the substrate processing method including a rotary table rotation step of rotating the rotary table around the rotational axis, a processing liquid supply step of supplying a processing liquid to a substrate rotating in response to rotation of the rotary table, and an opening magnet disposing step of disposing relative positions of the opening magnet and the rotary table at the first position in parallel with the rotary table rotation step and with the processing liquid supply step.

According to this method, a processing liquid is supplied to the major surface of the substrate being rotating. The processing liquid supplied to the major surface of the substrate receives a centrifugal force resulting from the rotation of the substrate, and flows toward the peripheral edge part of the substrate. As a result, the peripheral edge part of the substrate is subjected to liquid processing by means of the processing liquid.

Furthermore, in parallel with the rotation of the rotary table and with the supply of the processing liquid, relative positions of the opening magnet and the rotary table are placed at the first position in which the magnetic field generation region is formed in a region through which each driving magnet passes. In this case, it is possible to change the contact support position of the substrate by the movable pin in response to a change in phase of the rotation of the rotary table. Therefore, it is possible to supply the processing liquid to the whole area of the peripheral edge part of the substrate, and hence is possible to excellently process the peripheral edge part of the substrate thereby without the unfinished remainder of processing.

The aforementioned or other objects, features, and effects of the present invention will be clarified by the following description of preferred embodiments given below with reference to the accompanying drawings.

BRIEF DESCRIPTION OF THE DRAWINGS

FIG. 6 is a partially enlarged cross-sectional view of the arrangement of FIG. 5.

FIG. 7 is an enlarged cross-sectional view of an arrangement near a movable pin included in the spin chuck.

FIG. 8A is a schematic view showing a state of each movable pin when an inner elevated/lowered magnet and an outer elevated/lowered magnet are each at a lower position. FIG. 8B is a schematic view showing a state of each movable pin when the inner elevated/lowered magnet is at an upper position and when the outer elevated/lowered magnet is at the lower position. FIG. 8C is a schematic view showing a state of each movable pin when the inner elevated/lowered magnet and the outer elevated/lowered magnet are each at the upper position.

DETAILED DESCRIPTION OF PREFERRED EMBODIMENTS

Figure 1:
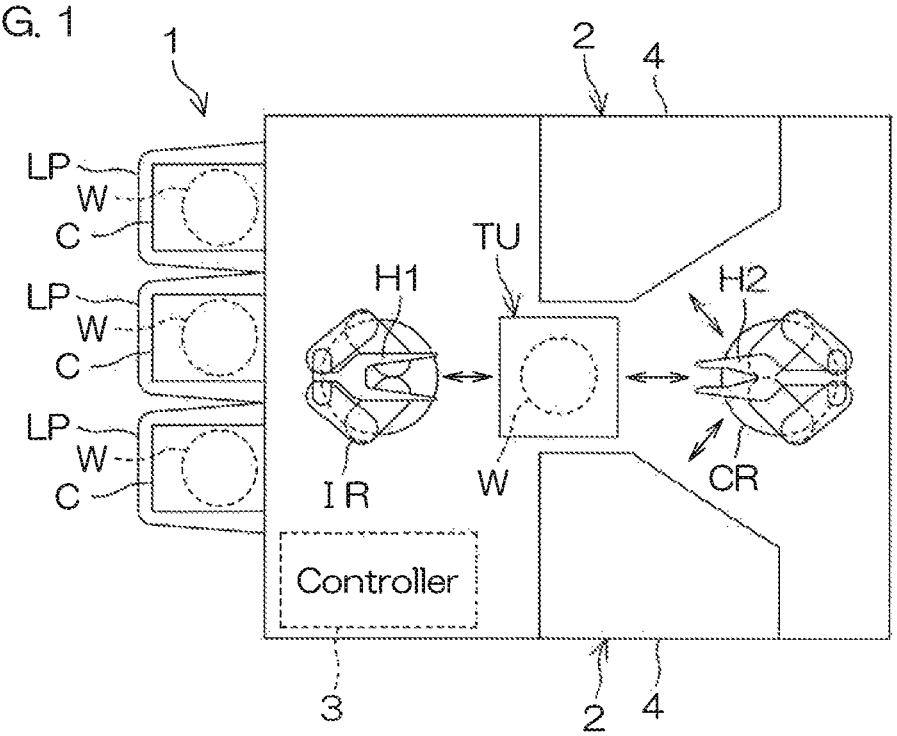
FIG. 1 is an illustrative plan view to describe a layout of the inside of a substrate processing apparatus according to a preferred embodiment of the present invention.

FIG. 1 is an illustrative plan view to describe a layout of the inside of a substrate processing apparatus 1 according to a preferred embodiment of the present invention.

The substrate processing apparatus 1 is a single substrate processing type apparatus that processes disk-shaped substrates W made of semiconductor wafers (semiconductor substrates) one at a time by means of a processing liquid or a processing gas. The substrate processing apparatus 1 includes load ports LP that holds a plurality of carriers C, a reversing unit TU that turns over the posture of a substrate W upwardly and downwardly, and a plurality of processing units 2 that process substrates W. The load ports LP and the processing units 2 are spaced out in a horizontal direction. The turnover unit TU is disposed on a conveying path of a substrate W conveyed between the load port LP and the processing unit 2.

As shown in FIG. 1, the substrate processing apparatus 1 further includes an indexer robot IR disposed between the load port LP and the turnover unit TU, a center robot CR disposed between the turnover unit TU and the processing unit 2, and a controller 3 that controls the operation of devices included in the substrate processing apparatus 1 and that controls the opening and closing of a valve. The indexer robot IR conveys a plurality of substrates W from the carrier C held by the load port LP to the turnover unit TU one by one, and conveys a plurality of substrates W from the turnover unit TU to the carrier C held by the load port LP one by one. Likewise, the center robot CR conveys a plurality of substrates W from the turnover unit TU to the processing unit 2 one by one, and conveys a plurality of substrates W from the processing unit 2 to the turnover unit TU one by one. The center robot CR further conveys a substrate W between the processing units 2.

The indexer robot IR has a hand H1 that horizontally supports a substrate W. The indexer robot IR horizontally moves the hand H1. The indexer robot IR further raises and lowers the hand H1, and rotates the hand H1 around a vertical axis. Similarly, the center robot CR has a hand H2 that horizontally supports a substrate W. The center robot CR horizontally moves the hand H2. The center robot CR further raises and lowers the hand H2, and rotates the hand H2 around a vertical axis.

A substrate W is housed in the carrier C in a state (upward posture) in which a front surface Wa, on which a device is formed, of the substrate W is directed upwardly. The controller 3 allows the indexer robot IR to convey the substrate W from the carrier C to the turnover unit TU in a state in which the front surface Wa (see FIG. 2 and so forth) is directed upwardly. Thereafter, the controller 3 allows the turnover unit TU to turn the substrate W upside down. As a result, a rear surface Wb (see FIG. 2 and so forth) of the substrate W is directed upwardly. Thereafter, the controller 3 allows the center robot CR to convey the substrate W from the turnover unit TU to the processing unit 2 in a state in which the rear surface Wb is directed upwardly. Thereafter, the controller 3 allows the processing unit 2 to process the rear surface Wb of the substrate W.

After the rear surface Wb of the substrate W is processed, the controller 3 allows the center robot CR to convey the substrate W from the processing unit 2 to the turnover unit TU in a state in which the rear surface Wb is directed upwardly. Thereafter, the controller 3 allows the turnover unit TU to turn the substrate W upside down. As a result, the front surface Wa of the substrate W is directed upwardly. Thereafter, the controller 3 allows the indexer robot IR to convey the substrate W from the turnover unit TU to the carrier C in a state in which the front surface Wa is directed upwardly. As a result, the substrate W that has been processed is housed in the carrier C. The controller 3 allows the indexer robot IR and so forth to repeatedly perform this series of operations, and hence to process a plurality of substrates W one by one.

Figure 2:
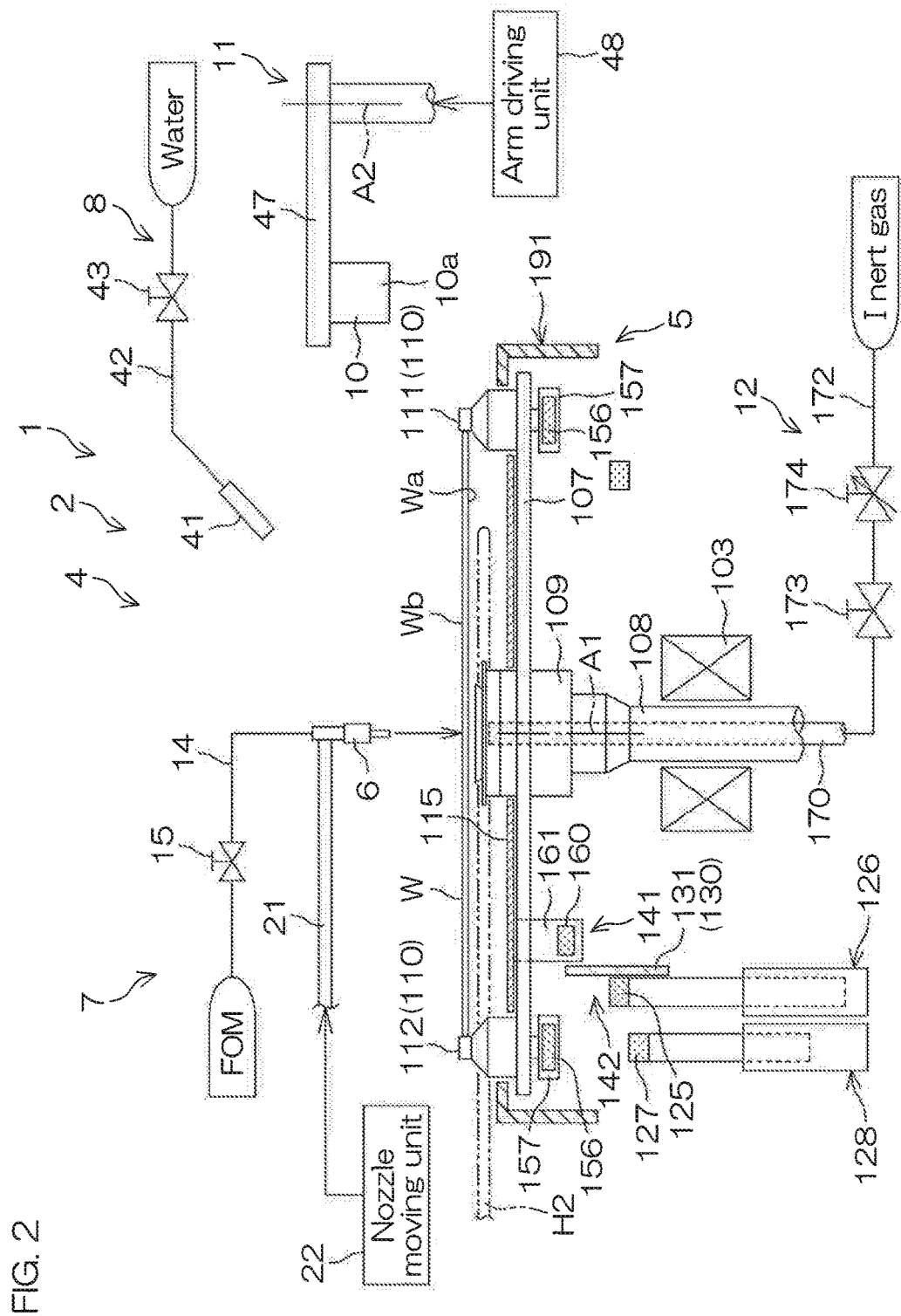
FIG. 2 is an illustrative cross-sectional view to describe a arrangement example of a processing unit included in the substrate processing apparatus.
Figure 3:
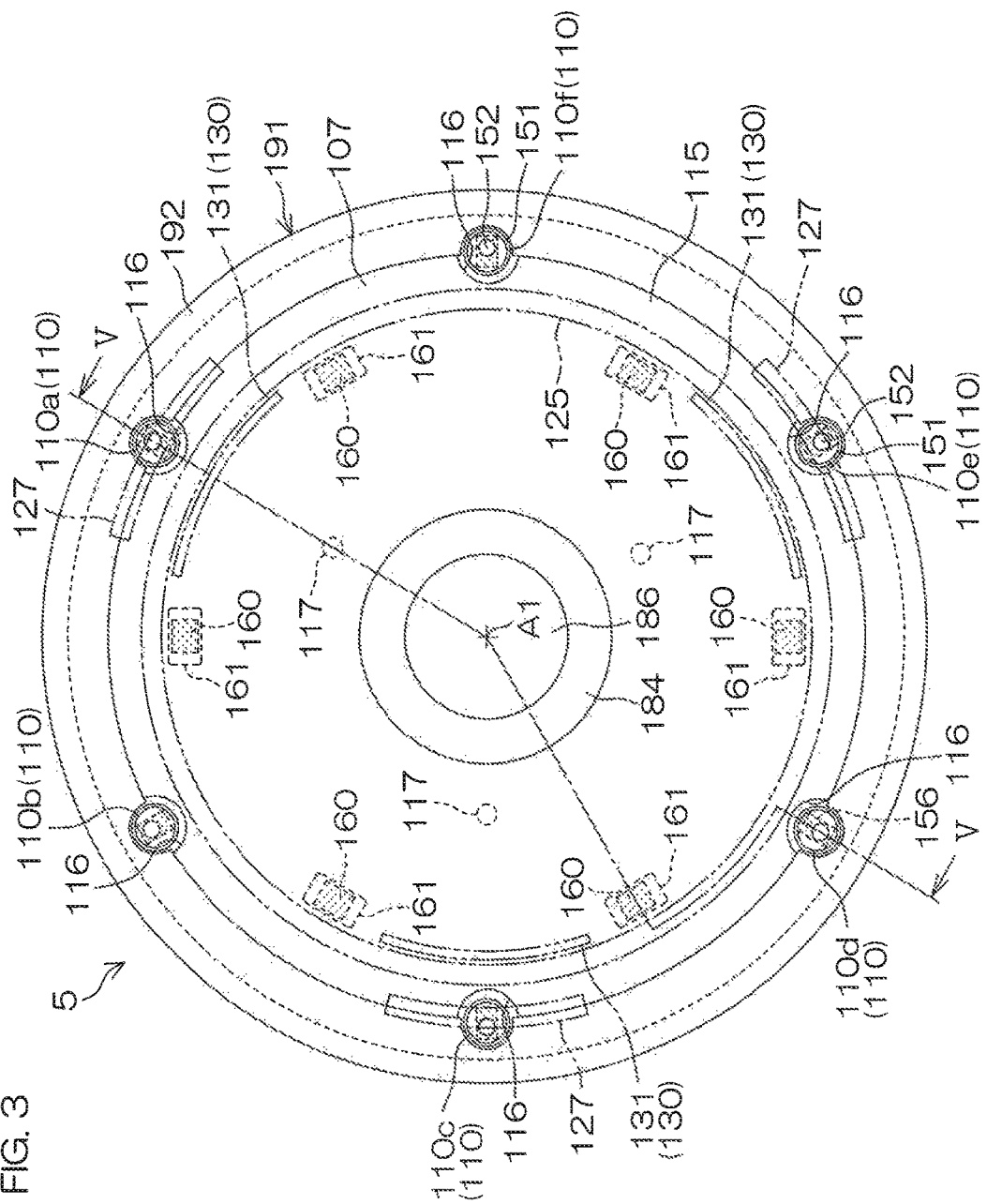
FIG. 3 is a plan view to describe a more concrete arrangement of a spin chuck included in the substrate processing apparatus.
Figure 4:
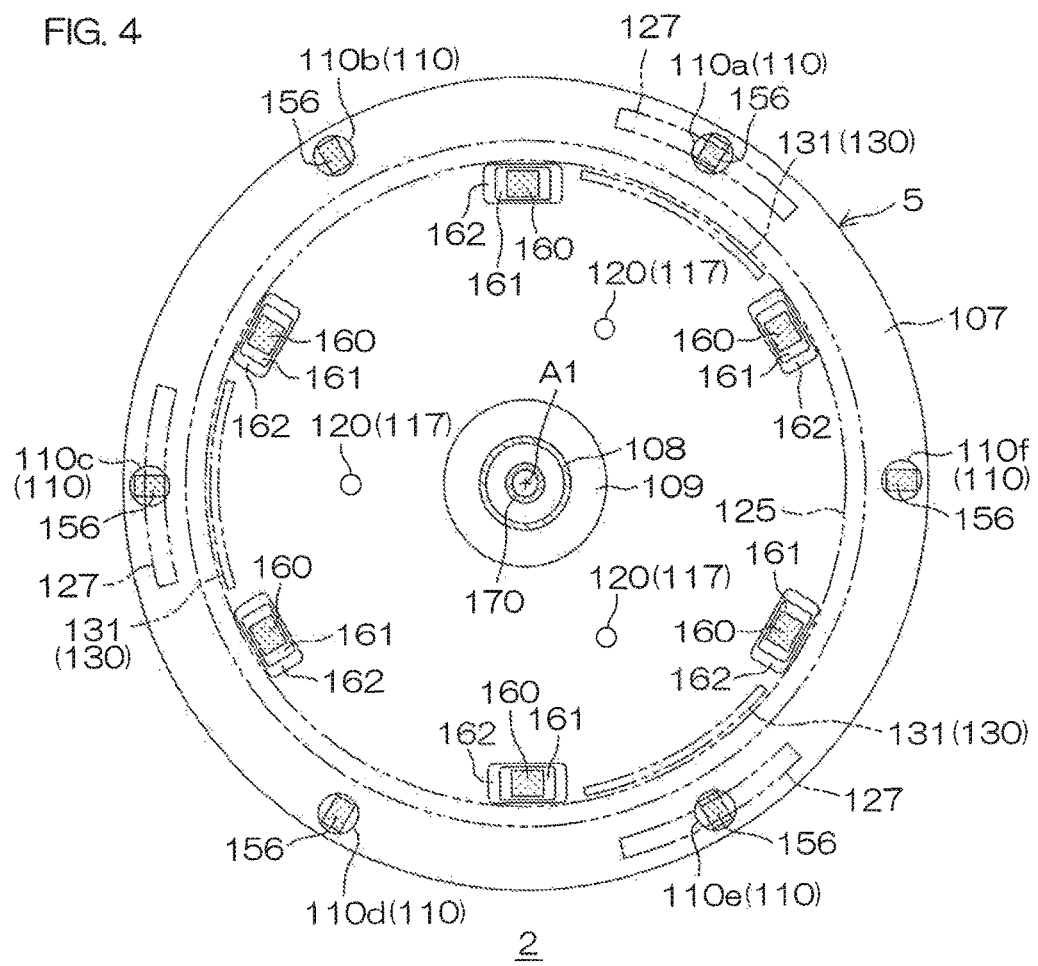
FIG. 4 is a bottom plan view of the arrangement of FIG. 3.
Figure 5:
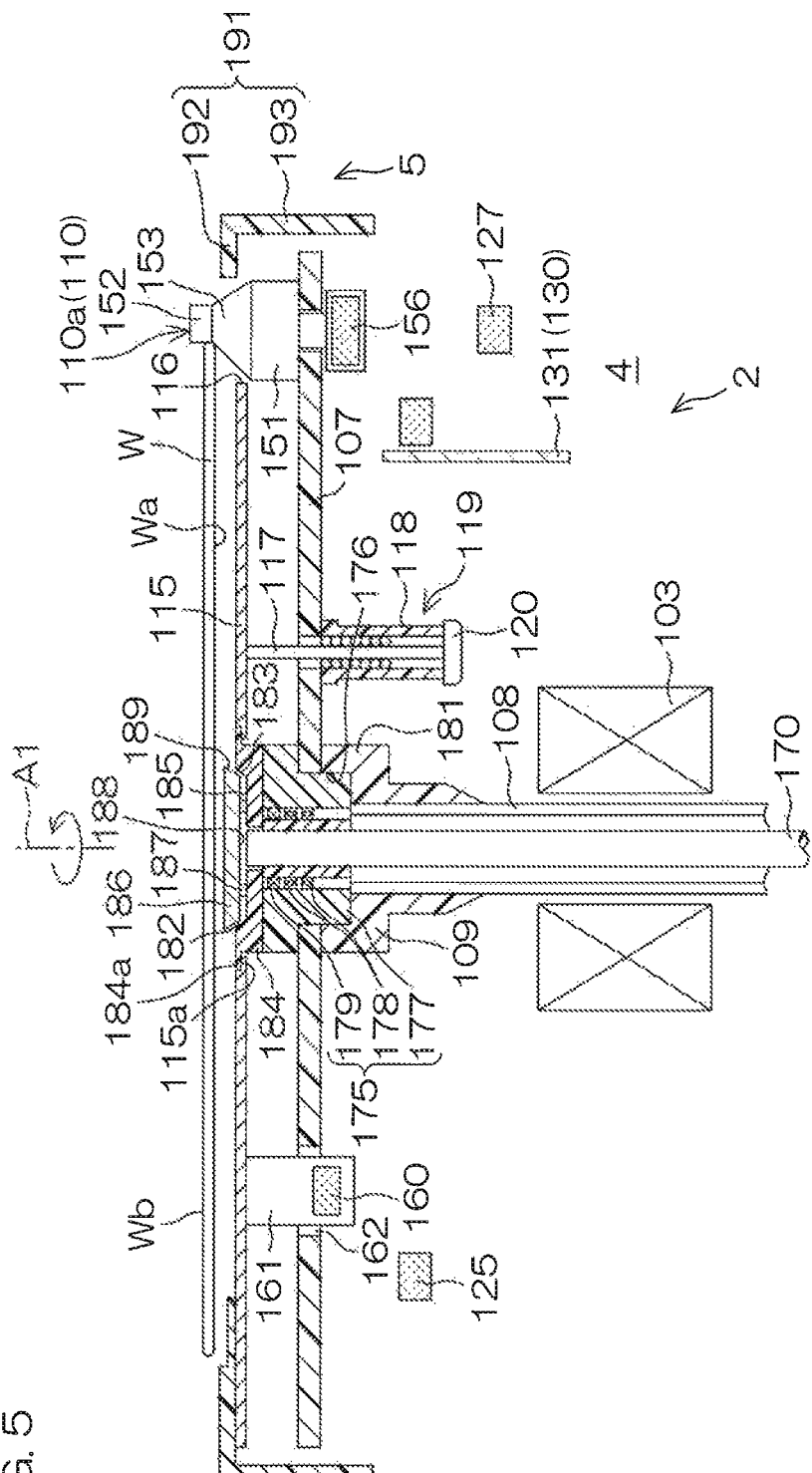
FIG. 5 is a cross-sectional view seen from cross-section line V-V of FIG. 3.

FIG. 2 is an illustrative cross-sectional view to describe a arrangement example of a processing unit 2 included in the substrate processing apparatus 1. FIG. 3 is a plan view to describe a more concrete arrangement of a spin chuck 5 included in the substrate processing apparatus 1. FIG. 4 is a bottom plan view of the arrangement of FIG. 3. FIG. 5 is a cross-sectional view seen from cross-section line V-V of FIG. 3. FIG. 6 is a partially enlarged cross-sectional view of the arrangement of FIG. 5. FIG. 7 is an enlarged cross-sectional view in which an arrangement near a movable pin 110 included in the spin chuck 5 is enlarged.

As shown in FIG. 2, the processing unit 2 includes a box-shaped processing chamber 4 that has an internal space, a spin chuck (substrate holding/rotating device) 5 that rotates a substrate W around a vertical rotational axis A1 passing through the center of the substrate W while holding the substrate W in the processing chamber 4 in a horizontal posture, a chemical liquid supplying unit (processing liquid supplying unit) 7 that supplies a hydrofluoric acid solution including ozone (hereinafter, referred to as FOM), which is one example of a chemical liquid (processing liquid), toward the upper surface (rear surface (one major surface) Wb) of the substrate W held by the spin chuck 5, a water supplying unit (processing liquid supplying unit) 8 that supplies water, which serves as a rinse liquid (processing liquid), to the upper surface of the substrate W held by the spin chuck 5, a cleaning brush 10 that comes into contact with the upper surface of the substrate W and scrubs this upper surface, a cleaning-brush driving unit 11 that drives the cleaning brush 10, a protective gas supplying unit 12 that supplies an inert gas, which serves as a protective gas, to the lower surface (front surface (one other major surface) Wa) of the substrate W held by the spin chuck 5, and a cylindrical processing cup (not shown) that surrounds the spin chuck 5.

As shown in FIG. 2, the processing chamber 4 includes a box-shaped partition wall (not shown), an FFU (fan filter unit, not shown) that serves as a blower unit that sends clean air from an upper part of the partition wall to the inside of the partition wall (corresponding to the inside of the processing chamber 4), and an exhaust device (not shown) that discharges a gas in the processing chamber 4 from a lower part of the partition wall. A down flow (downward flow) is generated inside the processing chamber 4 by means of the FFU and the exhaust device.

As shown in FIG. 2, the spin chuck 5 includes a rotary table 107 that is rotatable around the rotational axis A1 in the vertical direction. A rotational shaft 108 is joined to the lower surface of the rotational center of the rotary table 107 through a boss 109. The rotational shaft 108 is a hollow shaft, and extends in the vertical direction, and is arranged to be rotated around the rotational axis A1 while receiving a driving force from a rotation driving unit 103. The rotation driving unit 103 may be, for example, an electric motor that uses the rotational shaft 108 as a driving shaft.

As shown in FIG. 2, the spin chuck 5 further includes a plurality of (in the present preferred embodiment, six) movable pins that are substantially evenly spaced out in the circumferential direction at the peripheral edge part of the upper surface of the rotary table 107. Each movable pin 110 is arranged to horizontally hold the substrate W in an upper substrate-holding height that has a predetermined space from the rotary table 107 having a substantially horizontal upper surface. In other words, holding pins included in the spin chuck 5 are all the movable pins 110.

The rotary table 107 is formed in a disk shape along a horizontal plane, and is joined to the boss 109 joined to the rotational shaft 108.

As shown in FIG. 3, the movable pins 110 are disposed at the peripheral edge part of the upper surface of the rotary table 107 at equal intervals in the circumferential direction. The movable pins 110 have mutually-common specifications. The six movable pins 110 are set to be groups each of which consists of three movable pins 110 that do not adjoin each other. In FIG. 3, a group consisting of a movable pin 110a, a movable pin 110c, and a movable pin 110e and a group consisting of a movable pin 110b, a movable pin 110d, and a movable pin 110f are set as groups differing from each other.

In other words, the six movable pins 110 includes three movable pins 110a, 110c, and 110e (110) included in a first movable pin group 111 (FIG. 9A etc.) and three movable pins 110b, 110d, and 110f (110) included in a second movable pin group 112, and the movable pins 110 included in the first movable pin group 111 and the movable pins 110 included in the second movable pin group 112 (FIG. 9A etc.) are arranged alternately with respect to the circumferential direction of the rotary table 107. When attention is paid to the first movable pin group 111, the three movable pins 110 are disposed at equal intervals (intervals of 120°), and when attention is paid to the second movable pin group 112, the three movable pins 110 are disposed at equal intervals (intervals of 120°).

Each movable pin 110 includes a lower shaft portion 151 joined to the rotary table 107 and an upper shaft portion (support portion) 152 integrally formed at the upper end of the lower shaft portion 151, and the lower shaft portion 151 and the upper shaft portion 152 are each formed in a cylindrical shape. The upper shaft portion 152 is disposed eccentrically from the central axis of the lower shaft portion 151. The surface that connects the upper end of the lower shaft portion 151 and the lower end of the upper shaft portion 152 together forms a tapered surface 153 that descends from the upper shaft portion 152 toward the circumferential surface of the lower shaft portion 151.

As shown in FIG. 7, the movable pin 110 is joined to the rotary table 107 so that the lower shaft portion 151 is rotatable around a rotational axis A3 that is coaxial with its central axis. In more detail, a support shaft 155 that is supported by the rotary table 107 with a bearing 154 therebetween is disposed at the lower end part of the lower shaft portion 151. A magnet holding member 157 that holds a driving permanent magnet (driving magnet) 156 is joined to the lower end of the support shaft 155. The driving permanent magnet 156 is disposed such that, for example, the polar direction takes a direction perpendicular to the rotational axis A3 of the movable pin 110. The driving permanent magnets 156 are each disposed so as to have the same polar direction with respect to a direction perpendicular to the rotational axis A3 (with respect to a direction perpendicular to an axis along the rotational axis) in a state in which an external force is not applied to the movable pin 110 corresponding to the driving permanent magnet 156.

The driving permanent magnet 156 is disposed so that the upper shaft portion 152 moves to a hold position that has approached the rotational axis A1 when the driving permanent magnet 156 receives an attractive magnetic force from a closing permanent magnet (closing magnet) 125 (a magnetic force exceeding an elastic pressing force by means of an elastic pressing member).

As shown in FIG. 2, a plurality of opening permanent magnets (opening magnets) 127 are disposed below the rotary table 107 in the circumferential direction of the rotary table 107. In detail, three opening permanent magnets 127 (which are equal in number to the movable pins 110 included in each movable pin group 111, 112) that form a circular arc centering on the rotational axis A1 are disposed at mutually common height positions, respectively, and with intervals in the circumferential direction of the rotary table 107. The three opening permanent magnets 127 have mutually-identical specifications, and are evenly spaced out in the circumferential direction on a circumference that is coaxial with the rotational axis A1. Each opening permanent magnet 127 is disposed along a plane (horizontal plane) perpendicular to the rotational axis A1. In more detail, each opening permanent magnet 127 is disposed at substantially the same position as the driving permanent magnet 156 with respect to the rotational axis A1 or at a slightly outer position in a radial direction than the driving permanent magnet 156 (FIG. 3 and FIG. 4 each show an example in which the magnet 127 is disposed at substantially the same position). The length (angle) in the circumferential direction of each opening permanent magnet 127 is about 30°. The reason why the length (angle) in the circumferential direction of each opening permanent magnet 127 is set at about 30° is that the length in the circumferential direction of a magnetic field generation region 129 (see FIG. 9A and so forth) formed in an annular region through which the driving permanent magnet 156 that rotates in response to the rotation of the rotary table 107 passes is set to substantially coincide with about 60° (an arrangement interval in the circumferential direction of the movable pin 110) when a substrate W is rotated at a liquid processing speed (e.g., about 500 rpm) as described later.

The polar direction of each opening permanent magnet 127 follows an up-down direction in the present preferred embodiment. The upper surface of each opening permanent magnet 127 has a magnetic pole opposite to the magnetic pole of the upper surface of the closing permanent magnet 125 in a ring shape. If the upper surface of the closing permanent magnet 125 is, for example, the S pole, the upper surface of each opening permanent magnet 127 also has the S pole as homopolarity.

An outer elevated/lowered unit (first relative movement unit) 128 that raises and lowers the plurality of opening permanent magnets 127 in one operation is connected to the opening permanent magnet 127. The outer elevated/lowered unit 128 is configured to include, for example, a cylinder disposed so as to be extensible and contractible in the up-down direction, and is supported by this cylinder. The outer elevated/lowered unit 128 may be configured to use an electric motor. Additionally, the outer elevated/lowered unit 128 may raise and lower the opening permanent magnets 127 individually.

A magnetic force acts between the opening permanent magnet 127 and the driving permanent magnet 156 in a state in which the opening permanent magnet 127 is disposed at an upper position (first position, see FIG. 12C) at which its magnetic pole approaches the driving permanent magnet 156 in the up-down direction and in which the opening permanent magnet 127 and the driving permanent magnet 156 face each other in a lateral direction.

As shown in FIG. 2, the closing permanent magnet (closing magnet) 125 is disposed below the rotary table 107. An inner elevated/lowered unit (second relative movement unit) 126 that raises and lowers the closing permanent magnet 125 is connected to the closing permanent magnet 125. The inner elevated/lowered unit 126 is configured to include, for example, a cylinder disposed so as to be extensible and contractible in the up-down direction, and is supported by this cylinder. The inner elevated/lowered unit 126 may be configured to use a driving motor.

The closing permanent magnet 125 is formed in an annular shape that is coaxial with the rotational axis A1, and is disposed along a plane (horizontal plane) perpendicular to the rotational axis A1. In more detail, the closing permanent magnet 125 is disposed at a position farther than a protective-disk-side permanent magnet 160 described later and at a position closer than the driving permanent magnet 156 with respect to the rotational axis A1. In other words, in a plan view, the annular closing permanent magnet 125 is positioned between the protective-disk-side permanent magnet 160 and the driving permanent magnet 156. Additionally, the closing permanent magnet 125 is disposed at a position lower than the protective-disk-side permanent magnet 160. The polar direction of the closing permanent magnet 125 follows the horizontal direction, i.e., follows the rotational radial direction of the rotary table 107 in the present preferred embodiment. If the protective-disk-side permanent magnet 160 has the S pole in the lower surface, the closing permanent magnet 125 is configured to have the same magnetic pole, i.e., the S pole in a ring shape on the inner side in the rotational radial direction.

The movable pin 110 is driven to a hold position by means of a magnetic force acting between the closing permanent magnet 125 and the driving permanent magnet 156, and is held at the hold position in a state in which the closing permanent magnet 125 is disposed at an upper position (third position, see FIG. 8B and FIG. 12B) at which a ring-shaped magnetic pole is allowed to face the driving permanent magnet 156 in the horizontal direction.

A shielding member 130 that shields a magnetic field generated by the opening permanent magnet 127 and a magnetic field generated by the closing permanent magnet 125 is disposed below the rotary table 107. The shielding member 130 has three shielding plates 131 (which are equal in number to the opening permanent magnets 127) each of which has a circular-arc shape when viewed planarly and that are spaced out in the circumferential direction of the rotary table 107. Each shielding plate 131 has a circular-arc shape centering on the rotational axis A1. The three shielding plates 131 have mutually-identical specifications, and are evenly spaced out in the circumferential direction on a circumference that is coaxial with the rotational axis A1. Each shielding plate 131 is disposed inside the closing permanent magnet 125. The three shielding plates 131 have a one-to-one relationship with respect to the three opening permanent magnets 127. A pair of shielding plate 131 and opening permanent magnet 127 both of which correspond to each other are disposed in a mutually identical angle direction when viewed from the rotational axis A1. Additionally, the pair of shielding plate 131 and opening permanent magnet 127 both of which correspond to each other are mutually identical. Each shielding plate 131 may be attached to the closing permanent magnet 125 so as to be raised and lowered together with the closing permanent magnet 125, or may be attached to another supporting member that is provided so as not to be relatively rotated with respect to the rotary table 107 and so as not to be relatively raised and lowered with respect to the rotary table 107. The width in the up-down direction of each shielding plate 131 is set to have an extent that makes it possible to completely shield a magnetic field generated by the opening permanent magnet 127 and a magnetic field generated by the closing permanent magnet 125.

The movable pin 110 has the upper shaft portion 152 at a position that is eccentric from the rotational axis A3 as described above with reference to FIG. 7. In other words, the central axis B of the upper shaft portion 152 deviates from the rotational axis A3. Therefore, the rotation of the lower shaft portion 151 allows the upper shaft portion 152 to be displaced between an open position (see FIG. 8A described later) at which the central axis B is far apart from the rotational axis A1 and a hold position (see FIG. 8B described later) at which the central axis B has approached the rotational axis A1. The upper shaft portion 152 of the movable pin 110 is urged toward the open position by means of an elastic pressing force of an elastic pressing member, such as a spring, (not shown). Therefore, when the driving permanent magnet 156 does not receive an attractive magnetic force from the closing permanent magnet 125, the movable pin 110 is placed at the open position that is apart from the rotational axis A1.

As shown in FIG. 2, the spin chuck 5 further includes a protective disk 115 disposed between the upper surface of the rotary table 107 and the substrate holding height determined by the movable pin 110. The protective disk 115 is joined so as to be movable in the up-down direction with respect to the rotary table 107, and is movable between a lower position close to the upper surface of the rotary table 107 and an approach position at which the protective disk 115 has approached the lower surface of the substrate W held by the movable pin 110 with a slight interval between the protective disk 115 and the substrate W above the lower position. The protective disk 115 is a disk-shaped member that is slightly larger in diameter than the substrate W, and has cutouts 116 formed at positions corresponding to the movable pins 110 in order to avoid the movable pins 110.

The rotational shaft 108 is a hollow shaft, and has its inside into which an inert gas supply pipe 170 is inserted. An inert gas supply passage 172 that guides an inert gas, which is one example of a protective gas and which is supplied from an inert gas supply source, is joined to the lower end of the inert gas supply pipe 170. An inert gas such as CDA (clean dry air) or a nitrogen gas can be mentioned as the inert gas guided to the inert gas supply passage 172. An inert gas valve 173 and an inert gas flow control valve 174 are interposed at a place between both ends of the inert gas supply passage 172. The inert gas valve 173 opens and closes the inert gas supply passage 172. An inert gas is sent to the inert gas supply pipe 170 by opening the inert gas valve 173. This inert gas is supplied to a space between the protective disk 115 and the lower surface of the substrate W by means of an arrangement described later. As thus described, the protective gas supplying unit 12 is composed of the inert gas supply pipe 170, the inert gas supply passage 172, the inert gas valve 173, etc.

The protective disk 115 is a substantially disk-shaped member that is substantially equal in size to the substrate W. Cutouts 116 are formed at the peripheral edge part of the protective disk 115 at positions corresponding to the movable pins 110 in such a manner as to border the movable pin 110 while securing a regular interval from the outer peripheral surface of the movable pin 110. A circular opening corresponding to the boss 109 is formed in a central region of the protective disk 115.

As shown in FIG. 3 and FIG. 5, a guide shaft 117 that extends in the vertical direction in parallel with the rotational axis A1 is joined to the lower surface of the protective disk 115 at a position that is farther from the rotational axis A1 than the boss 109. In the present preferred embodiment, the guide shafts 117 are disposed at three places, respectively, that are evenly spaced out in the circumferential direction of the protective disk 115. In more detail, three guide shafts 117 are respectively disposed at angle positions corresponding to alternate movable pins 110 when viewed from the rotational axis A1. The guide shaft 117 is joined to a linear bearing 118 disposed at a corresponding place of the rotary table 107, and is movable in the vertical direction, i.e., in a direction parallel to the rotational axis A1 while being guided by the linear bearing 118. Therefore, the guide shaft 117 and the linear bearing 118 compose a guide unit 119 that guides the protective disk 115 in the up-down direction parallel to the rotational axis A1.

The guide shaft 117 passes through the linear bearing 118, and has its lower end at which a flange 120 protruding outwardly is formed. The flange 120 is brought into contact with the lower end of the linear bearing 118, and, as a result, the guide shaft 117 is restrained from moving upwardly, i.e., the protective disk 115 is restrained from moving upwardly. In other words, the flange 120 is a restricting member that restrains the protective disk 115 from moving upwardly.

A magnet holding member 161 holding the protective-disk-side permanent magnet 160 is fixed to the lower surface of the protective disk 115 at a position that is on the outer side farther from the rotational axis A1 than the guide shaft 117 and that is on the inner side closer to the rotational axis A1 than the movable pin 110. In the present preferred embodiment, the protective-disk-side permanent magnet 160 is held by the magnet holding member 161 in a state in which the polar direction follows the up-down direction. For example, the protective-disk-side permanent magnet 160 may be fixed to the magnet holding member 161 so as to have the S pole on the lower side and so as to have the N pole on the upper side. In the present preferred embodiment, the magnet holding members 161 are disposed at six places, respectively, that are evenly spaced out in the circumferential direction. In more detail, each magnet holding member 161 is disposed at an angle position corresponding to a position between adjoining movable pins 110 (in the present preferred embodiment, an intermediate position therebetween) when viewed from the rotational axis A1. Additionally, three guide shafts 117 are respectively disposed in alternate angle regions (in the present preferred embodiment, at a central position of the angle region) among six angle regions divided by the six magnet holding members 161 (in the present preferred embodiment, equally divided) when viewed from the rotational axis A1.

As shown in FIG. 4, the rotary table 107 has through-holes 162 formed at six places corresponding to the six magnet holding members 161. Each through-hole 162 is formed so as to allow a corresponding one of the magnet holding members 161 to be inserted thereinto in the vertical direction parallel to the rotational axis A1. When the protective disk 115 is at the lower position, the magnet holding member 161 passes through the through-hole 162, and protrudes downwardly from the lower surface of the rotary table 107, and the protective-disk-side permanent magnet 160 is positioned below the lower surface of the rotary table 107.

When the closing permanent magnet 125 is at the upper position (see FIG. 12B), a repulsive magnetic force acts between the closing permanent magnet 125 and the protective-disk-side permanent magnet 160, and the protective-disk-side permanent magnet 160 receives an upward external force. As a result, the protective disk 115 receives an upward force from the magnet holding member 161 holding the protective-disk-side permanent magnet 160, and is held at a processing position that has approached the lower surface of the substrate W.

In a state in which the closing permanent magnet 125 is disposed at the lower position (fourth position, see FIG. 12B and so forth) apart downwardly from the upper position (see FIG. 12B), a repulsive magnetic force is small between the closing permanent magnet 125 and the protective-disk-side permanent magnet 160, and therefore the protective disk 115 is held at the lower position closer to the upper surface of the rotary table 107 because of its own weight. Additionally, the closing permanent magnet 125 does not face the driving permanent magnet 156, and therefore an external force that urges a movable pin 110 toward its hold position does not act on this movable pin 110.

Therefore, when the closing permanent magnet 125 is at the lower position, the protective disk 115 is at the lower position closer to the upper surface of the rotary table 107, and the movable pin 110 is held at the open position. In this state, the center robot CR that carries a substrate W into or from the spin chuck 5 enables its hand H2 to enter a space between the protective disk 115 and the lower surface of the substrate W.

The protective-disk-side permanent magnet 160, the closing permanent magnet 125, and the inner elevated/lowered unit 126 compose a magnetic floating unit 141 that floats the protective disk 115 upwardly from the surface of the rotary table 107 by means of a repulsive force between the permanent magnets 125 and 160 and that guides the protective disk 115 to a processing position. The driving permanent magnet 156, the closing permanent magnet 125, and the inner elevated/lowered unit 126 compose a magnetic driving unit 142 that holds the movable pin 110 by means of a magnetic force between the permanent magnets 125 and 156 at its hold position.

In other words, the magnetic floating unit 141 and the magnetic driving unit 142 share the closing permanent magnet 125 and the inner elevated/lowered unit 126. When the closing permanent magnet 125 is at the upper position, the protective disk 115 is held at the approach position by means of a magnetic repulsive force between the closing permanent magnet 125 and the protective-disk-side permanent magnet 160, and the movable pin 110 is held at the hold position by means of a magnetic attractive force between the closing permanent magnet 125 and the driving permanent magnet 156.

As shown in the enlarged view of FIG. 6, the boss 109 joined to the upper end of the rotational shaft 108 holds a bearing unit 175 that supports the upper end part of the inert gas supply pipe 170. The bearing unit 175 is composed of a spacer 177 fitted and fixed to a recess 176 formed in the boss 109, a bearing 178 disposed between the spacer 177 and the inert gas supply pipe 170, and a magnetic fluid bearing 179 disposed above the bearing 178 similarly between the spacer 177 and the inert gas supply pipe 170.

As shown in FIG. 5, the boss 109 integrally has a flange 181 that protrudes outwardly along a horizontal plane, and the rotary table 107 is joined to this flange 181. Additionally, the spacer 177 mentioned above is fixed to the flange 181 in such a way as to sandwich the inner peripheral edge portion of the rotary table 107, and a cover 184 is joined to this spacer 177. The cover 184 is formed in a substantially disk shape, and has its central part having an opening by which the upper end of the inert gas supply pipe 170 is exposed, and has its upper surface on which a recess 185 whose bottom surface is this opening is formed. The recess 185 has the bottom surface that is horizontal and an inverted-cone-shaped oblique surface 183 that uprises obliquely upwardly from the peripheral edge of the bottom surface toward the outside. A rectifying member 186 is joined to the bottom surface of the recess 185. The rectifying member 186 has a plurality of (e.g., four) leg portions 187 that are spaced out in the circumferential direction around the rotational axis A1 in a discrete manner, and has its bottom surface 188 disposed with an interval from the bottom surface of the recess 185 by means of the leg portions 187. An oblique surface 189 is formed which is an inverted-cone surface obliquely upwardly extending from the peripheral edge portion of the bottom surface 188 toward the outside.

As shown in FIG. 5 and FIG. 6, a flange 184a is outwardly formed at the outer peripheral edge of the upper surface of the cover 184. This flange 184a matches a stepped portion 115a formed at the inner peripheral edge of the protective disk 115. In other words, when the protective disk 115 is at the approach position at which it approaches the lower surface of the substrate W, the flange 184a and the stepped portion 115a are fitted to each other, and the upper surface of the cover 184 and the upper surface of the protective disk 115 are placed to be flush with each other, thus forming a flat inert gas flow passage.

By such an arrangement, the inert gas discharged from the upper end of the inert gas supply pipe 170 flows to a space partitioned by the bottom surface 188 of the rectifying member 186 in the recess 185 of the cover 184. This inert gas is furthermore blown in a radiative direction away from the rotational axis A1 through a radial flow passage 182 partitioned by the oblique surface 183 of the recess 185 and by the oblique surface 189 of the rectifying member 186. This inert gas forms an inert-gas flow in a space between the protective disk 115 and the lower surface of the substrate W held by the movable pin 110, and spouts from this space to the outside in the rotational radial direction of the substrate W.

As shown in FIG. 5, the peripheral edge portion of the upper surface of the protective disk 115 and the peripheral end of the protective disk 115 are protected by an annular cover 191. The cover 191 includes an annular plate portion 192 that projects in the horizontal direction from the peripheral edge portion of the upper surface toward the outside in the radial direction and a cylindrical portion 193 that droops from the peripheral end of the annular plate portion 192. The outer periphery of the annular plate portion 192 is positioned outside the peripheral end of the rotary table 107. The annular plate portion 192 and the cylindrical portion 193 are formed integrally with each other by use of, for example, a resin material that has chemical resistance. A cutout 194 that avoids the movable pin 110 is formed at a position on the inner periphery of the annular plate portion 192 that corresponds to the movable pin 110. The cutout 194 is formed so as to border a movable pin 110 while securing a predetermined interval from the outer peripheral surface of this movable pin 110. The annular plate portion 192 and the cylindrical portion 193 are formed integrally with each other by use of, for example, a resin material that has chemical resistance.

The annular plate portion 192 of the cover 191 has its upper surface having a narrowing portion 190 (see FIG. 13C) that narrows the flow passage of an inert gas in the peripheral edge portion of the substrate W held by the movable pin 110. This narrowing portion 190 makes it possible to reliably avoid or restrain the entrance of a processing liquid (chemical liquid or rinse liquid) present on the upper surface of the substrate W into an area inside the peripheral edge portion of the lower surface of the substrate W because the flow velocity of an inert gas flow spouted from a space between the cover 191 and the lower surface of the substrate W toward the outside becomes high.

As shown in FIG. 2, the chemical liquid supplying unit 7 includes a chemical liquid nozzle 6 through which FOM (chemical liquid) is discharged toward the upper surface of the substrate W, a nozzle arm 21 having its forward end to which the chemical liquid nozzle 6 is attached, and a nozzle moving unit 22 that moves the chemical liquid nozzle 6 by moving the nozzle arm 21.

The chemical liquid nozzle 6 is, for example, a straight nozzle that discharges FOM in a continuous flow state, and is attached to the nozzle arm 21, for example, in a perpendicular posture in which FOM is discharged in a direction perpendicular to the upper surface of the substrate W. The nozzle arm 21 extends in the horizontal direction, and is disposed so as to be turnable around a predetermined swing axis (not shown) that extends in the vertical direction around the spin chuck 5.

The chemical liquid supplying unit 7 includes a chemical liquid piping 14 that guides FOM to the chemical liquid nozzle 6 and a chemical liquid valve 15 that opens and closes the chemical liquid piping 14. When the chemical liquid valve 15 is opened, FOM discharged from a FOM supply source is supplied from the chemical liquid piping 14 to the chemical liquid nozzle 6. As a result, FOM is discharged from the chemical liquid nozzle 6.

By turning the nozzle arm 21 around the swing axis, the nozzle moving unit 22 horizontally moves the chemical liquid nozzle 6 along a path running through a central part of the upper surface of the substrate W when viewed planarly. The nozzle moving unit 22 horizontally moves the chemical liquid nozzle 6 between a processing position at which FOM discharged from the chemical liquid nozzle 6 adheres to the upper surface of the substrate W and a home position at which the chemical liquid nozzle 6 is set around the spin chuck 5 when viewed planarly. The nozzle moving unit 22 further horizontally moves the chemical liquid nozzle 6 between a central position at which FOM discharged from the chemical liquid nozzle 6 adheres to the central part of the upper surface of the substrate W and a peripheral edge position at which FOM discharged from the chemical liquid nozzle 6 adheres to the peripheral edge portion of the upper surface of the substrate W. Both the central position and the peripheral edge position are processing positions.

The chemical liquid nozzle 6 may be a fixed nozzle whose discharge port is fixedly disposed toward a predetermined position (for example, the central part) of the upper surface of the substrate W.

As shown in FIG. 2, the water supplying unit 8 includes a water nozzle 41. The water nozzle 41 is, for example, a straight nozzle that discharges a liquid in a continuous flow state, and is fixedly disposed above the spin chuck 5 in a state in which its discharge port is directed toward the central part of the upper surface of the substrate W. A water piping 42 to which water is supplied from a water supply source is connected to the water nozzle 41. A water valve 43 that performs switching between the supply and the supply stop of water from the water nozzle 41 is interposed at a place between both ends of the water piping 42. When the water valve 43 is opened, continuously-flowing water supplied from the water piping 42 to the water nozzle 41 is discharged from a discharge port formed at the lower end of the water nozzle 41. When the water valve 43 is closed, water stops being supplied from the water piping 42 to the water nozzle 41. This water is, for example, deionized water (DIW). Without being limited to DIW, the water may be any one of soda water, electrolyzed ion water, hydrogenated water, ozonized water, and hydrochloric acid water having a diluted concentration (e.g., about 10 ppm to 100 ppm).

The water nozzle 41 is not necessarily required to be fixedly disposed with respect to the spin chuck 5, and may employ, for example, a so-called scanning nozzle type in which a nozzle is attached to an arm swingable in a horizontal plane above the spin chuck 5 and in which a position of the upper surface of the substrate W to which water has adhered is scanned by the swing of the arm.

The cleaning brush 10 is a spongy scrub member made of, for example, PVA (polyvinyl alcohol), and is formed in a cylindrical shape. The cleaning brush 10 has its lower surface having a flat cleaning surface 10a. The cleaning surface 10a functions as a contact surface that comes into contact with the upper surface of the substrate W.

The cleaning-brush driving unit 11 includes a swing arm 47 having its forward end that holds the cleaning brush 10 and an arm driving unit 48 that drives the swing arm 47. The arm driving unit 48 is configured to be able to swing the swing arm 47 around the swing axis A2 extending in the vertical direction and to be able to move the swing arm 47 upwardly and downwardly. This arrangement makes it possible to horizontally move the cleaning brush 10 between a position above the substrate W and a home position fixed beside the spin chuck 5 when the substrate W is rotating while being held by the spin chuck 5.

Additionally, this arrangement makes it possible to scan a pressing position of the cleaning brush 10 in the radial direction of the substrate W between the central part of the substrate W and the peripheral edge portion of the substrate W while pressing the cleaning surface 10a of the cleaning brush 10 against the upper surface (rear surface Wb) of the substrate W.

When this scrub cleaning is performed, water (for example, pure water (deionized water)) is supplied from the water nozzle 41, and, as a result, foreign substances present on the rear surface Wb of the substrate W easily come off, and foreign substances that have been scrubbed off by use of the cleaning brush 10 are able to be discharged outwardly from the substrate W.

FIG. 8A to 8C are schematic views, each showing a state of the movable pin 110. FIG. 8A shows a state in which the closing permanent magnet 125 and the opening permanent magnet 127 are each at the lower position. FIG. 8B shows a state in which the closing permanent magnet 125 is at the upper position, and the opening permanent magnet 127 is at the lower position (second position). FIG. 8C shows a state in which the closing permanent magnet 125 and the opening permanent magnet 127 are each at the upper position.

As described above, in each movable pin 110, the movable pin 110 is urged to the hold position by means of the elastic pressing member (not shown). Therefore, in a state in which an external force does not act on the movable pin 110, the movable pin 110 receives an elastic pressing force from the elastic pressing member (not shown), and is urged to the open position. In a state in which the movable pin 110 is at the open position, the driving permanent magnet 156 is disposed so that, for example, the N pole is directed inwardly in the radial direction of the rotary table 107, and the S pole is directed outwardly in the radial direction of the rotary table 107.

In a state in which the closing permanent magnet 125 and the opening permanent magnet 127 are each at the lower position as shown in FIG. 8A, a magnetic force from the closing permanent magnet 125 and from the opening permanent magnet 127 does not act on the driving permanent magnet 156. Therefore, an external force does not act on the movable pin 110, and the movable pin 110 is placed at the open position.

The closing permanent magnet 125 is raised from the state of FIG. 8A, and is disposed at the upper position. The upper surface of the closing permanent magnet 125 approaches the driving permanent magnet 156, and, as a result, an attractive magnetic force is generated in the driving permanent magnet 156, and an attractive force is generated between the driving permanent magnet 156 and the closing permanent magnet 125. In a state in which the closing permanent magnet 125 is disposed at the upper position, the magnitude of the attractive magnetic force acting on the driving permanent magnet 156 exceeds an elastic pressing force applied by an elastic pressing member, and therefore the upper shaft portion 152 moves from the open position apart from the rotational axis A1 (see FIG. 2) toward the hold position that has approached the rotational axis A1. As a result, the movable pin 110 is urged to the hold position. In this state, the driving permanent magnet 156 is disposed so that, for example, the S pole is directed inwardly in the radial direction of the rotary table 107, and the N pole is directed outwardly in the radial direction of the rotary table 107 as shown in FIG. 8B.

The opening permanent magnet 127 is raised from the state of FIG. 8B, and is disposed at the upper position. In detail, as shown in FIG. 8C, the closing permanent magnet 125 and the opening permanent magnet 127 are each disposed at the upper position. The upper surface of the opening permanent magnet 127 approaches the driving permanent magnet 156, and, as a result, an attractive magnetic force is generated in the driving permanent magnet 156, and an attractive force is generated between the driving permanent magnet 156 and the opening permanent magnet 127. In other words, a force by which a movable pin 110 is compelled to go to the open position against an urging force that urges the movable pin 110 to the hold position is generated in the movable pin 110 being urged to the hold position by means of the closing permanent magnet 125. In the present preferred embodiment, in a state in which the closing permanent magnet 125 and the opening permanent magnet 127 are each disposed at the upper position, the magnitude of an attractive magnetic force that acts onto the driving permanent magnet 156 from the opening permanent magnet 127 (and a resultant force including an elastic pressing force generated by an elastic pressing member) slightly exceeds the magnitude of an attractive magnetic force that acts onto the driving permanent magnet 156 from the closing permanent magnet 125. Therefore, in a state in which the opening permanent magnet 127 is disposed at the upper position, as a result of a small quantity of turning of the movable pin 110 toward the open position, the upper shaft portion 152 moves to an intermediate position fixed between the open position and the hold position as shown in FIG. 8C. When the movable pin 110 is at the intermediate position, the central axis B of the upper shaft portion 152 is in a direction in which it recedes from the rotational axis A1 within a range of, for example, one tenth of several millimeters in comparison with a case in which the movable pin 110 is at the hold position.

FIG. 9A to 9F are views showing a plurality of movable pins 110 disposed at the rotary table 107.

In a state (shown in FIG. 8C) in which the opening permanent magnet 127 is disposed at the upper position and in which the rotary table 107 is rotating, three belt-shaped magnetic field generation regions 129 (that are identical in number with the opening permanent magnets 127) that extend in the circumferential direction of the rotary table 107 are intermittently disposed (are spaced out in the circumferential direction) in an annular region through which the driving permanent magnet 156 that rotates in response to the rotation of the rotary table 107 passes. Each magnetic field generation region 129 is a region in which a magnetic field formed by a magnetic force of an adjacent opening permanent magnet 127 exists. In a state in which the rotary table 107 is rotating, the length (angle) in the circumferential direction of each magnetic field generation region 129 is longer than the length (angle) in the circumferential direction of a corresponding opening permanent magnet 127. The length (angle) in the circumferential direction of each magnetic field generation region 129 (see FIG. 9A and so forth) is set at about 60°.

Three magnetic field generation regions 129 each of which has a length (angle) of 60° in the circumferential direction are disposed at equiangular intervals in the annular region through which the driving permanent magnet 156 that rotates in response to the rotation of the rotary table 107 passes. In this case, three driving permanent magnets 156 corresponding to three movable pins 110 included in the first movable pin group 111 simultaneously pass through the magnetic field generation region 129, or, alternatively, three driving permanent magnets 156 corresponding to three movable pins 110 included in the second movable pin group 112 simultaneously pass through the magnetic field generation region 129. In other words, in a state in which three driving permanent magnets 156 corresponding to three movable pins 110 included in the first movable pin group 111 are passing through the magnetic field generation region 129, three driving permanent magnets 156 corresponding to three movable pins 110 included in the second movable pin group 112 are not passing through the magnetic field generation region 129. In a state in which three driving permanent magnets 156 corresponding to three movable pins 110 included in the second movable pin group 112 are passing through the magnetic field generation region 129, three driving permanent magnets 156 corresponding to three movable pins 110 included in the first movable pin group 111 are not passing through the magnetic field generation region 129.

In a state in which the opening permanent magnet 127 is disposed at the upper position, three movable pins 110, among six movable pins 110, that correspond to three driving permanent magnets 156 that are simultaneously passing through the magnetic field generation region 129 are each disposed at the intermediate position from the hold position. In response to a phase change in each movable pin 110 resulting from the rotation of the rotary table 107, three driving permanent magnets 156 simultaneously passing through the magnetic field generation region 129 are switched between driving permanent magnets corresponding to three movable pins 110 included in the first movable pin group 111 and driving permanent magnets corresponding to three movable pins 110 included in the second movable pin group 112. In other words, in response to a phase change in each movable pin 110 resulting from the rotation of the rotary table 107, three movable pins 110 disposed at the intermediate position are switched between three movable pins 110 included in the first movable pin group 111 and three movable pins 110 included in the second movable pin group 112.

Figure 9A:
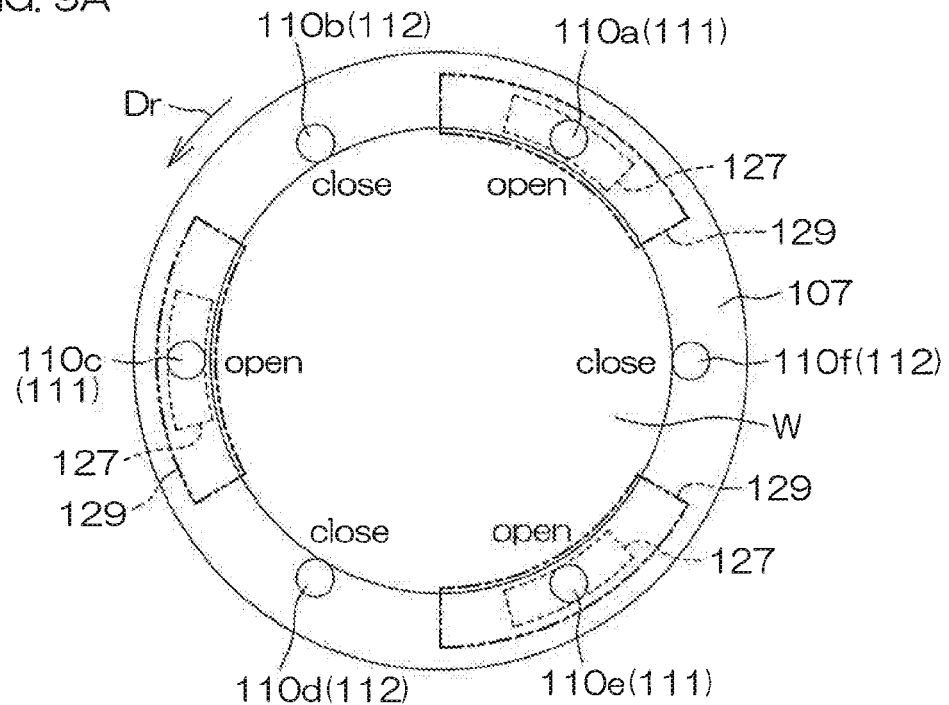
FIG. 9A to 9F are views each showing a state transition of each movable pin while the rotary table makes one rotation.
Figure 9B:
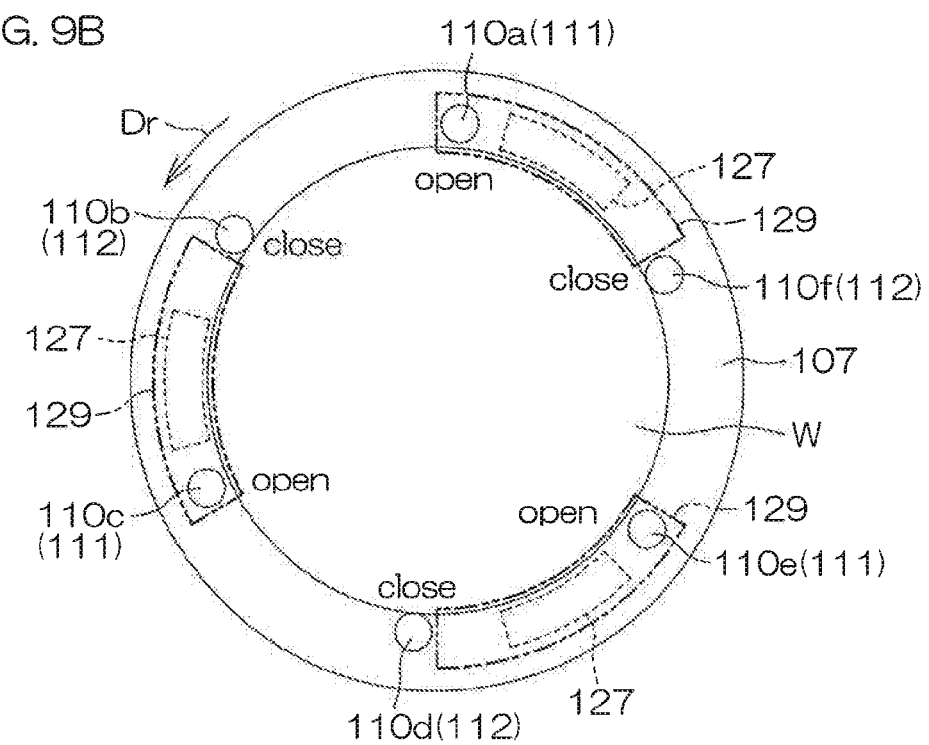

In the state of FIG. 9A, three movable pins 110a, 110c, and 110e included in the first movable pin group 111 and three opening permanent magnets 127 are placed in order in the circumferential direction of the rotary table 107, and therefore, three driving permanent magnets 156 (see FIG. 8C and so forth) corresponding to three movable pins 110a, 110c, and 110e included in the first movable pin group 111 each exist in the magnetic field generation region 129. Therefore, an attractive magnetic force exerted from the opening permanent magnet 127 is generated in three movable pins 110a, 110c, and 110e included in the first movable pin group 111, and these three movable pins 110a, 110c, and 110e included in the first movable pin group 111 are each disposed at the intermediate position (open). On the other hand, three driving permanent magnets 156 (see FIG. 8C and so forth) corresponding to three movable pins 110b, 110d, and 110f included in the secondmovable pin group 112 do not exist in the magnetic field generation region 129. Therefore, three movable pins 110b, 110d, and 110f included in the second movable pin group 112 are each disposed at the hold position (close). FIG. 9B shows a state in which the rotational phase of the rotary table 107 has advanced in a rotation direction Dr from the state of FIG. 9A.

Figure 9C:
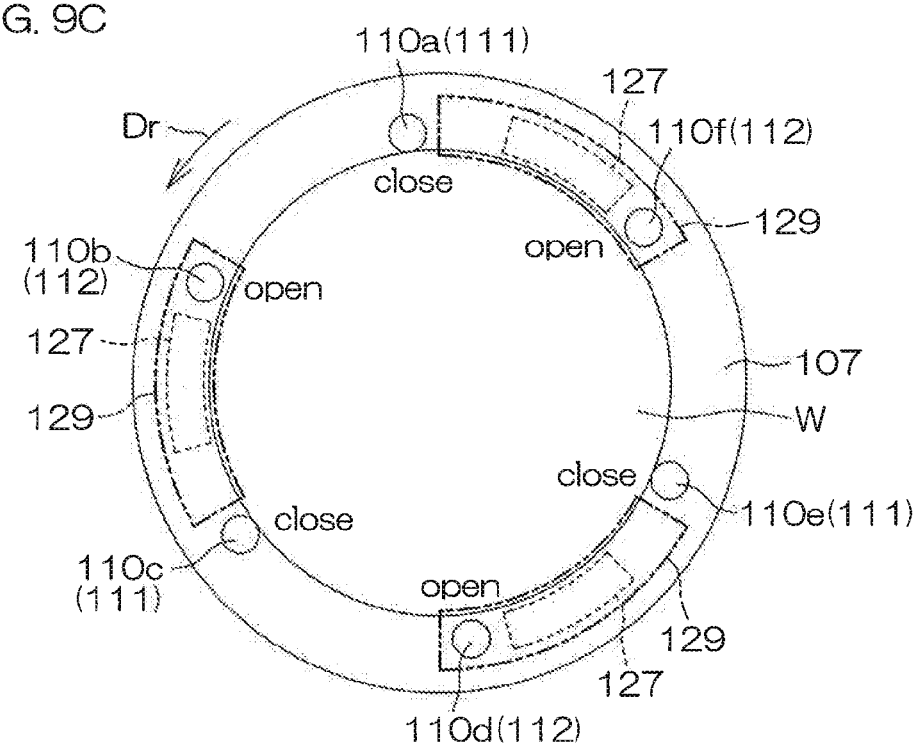

In the state of FIG. 9B, although three movable pins 110a, 110c, and 110e included in the first movable pin group 111 and three opening permanent magnets 127 deviate in the circumferential direction of the rotary table 107, the three movable pins 110a, 110c, and 110e included in the first movable pin group 111 still exist in the magnetic field generation region 129. Therefore, the three movable pins 110a, 110c, and 110e included in the first movable pin group 111 are still disposed at the intermediate position (open). On the other hand, three movable pins 110b, 110d, and 110f included in the second movable pin group 112 are still disposed at the hold position (close) because corresponding three driving permanent magnets 156 (see FIG. 8C and so forth) do not exist in the magnetic field generation region 129. FIG. 9C shows a state in which the rotational phase of the rotary table 107 has further advanced in the rotation direction Dr from the state of FIG. 9B.

Figure 9D:
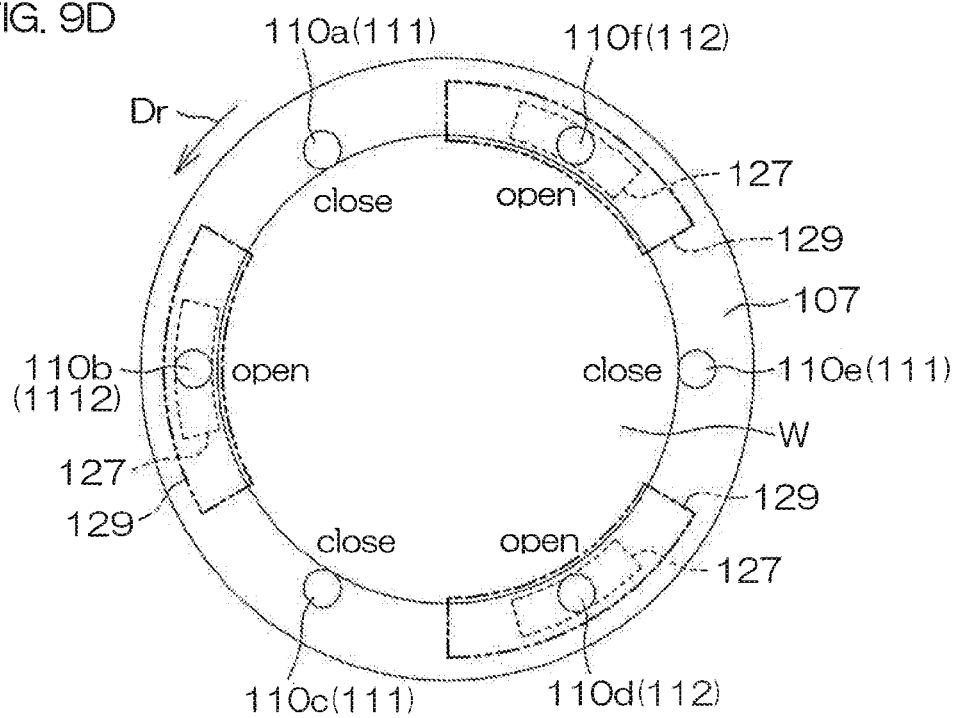

In the state of FIG. 9C, three movable pins 110a, 110c, and 110e included in the first movable pin group 111 each deviate outwardly from the magnetic field generation region 129. Therefore, these three movable pins 110a, 110c, and 110e included in the first movable pin group 111 are each disposed at the hold position (close). Instead, three movable pins 110b, 110d, and 110f included in the second movable pin group 112 enter the magnetic field generation region 129, and therefore these three movable pins 110b, 110d, and 110f included in the second movable pin group 112 are each disposed at the intermediate position (open). FIG. 9D shows a state in which the rotational phase of the rotary table 107 has further advanced in the rotation direction Dr from the state of FIG. 9C.

Figure 9E:
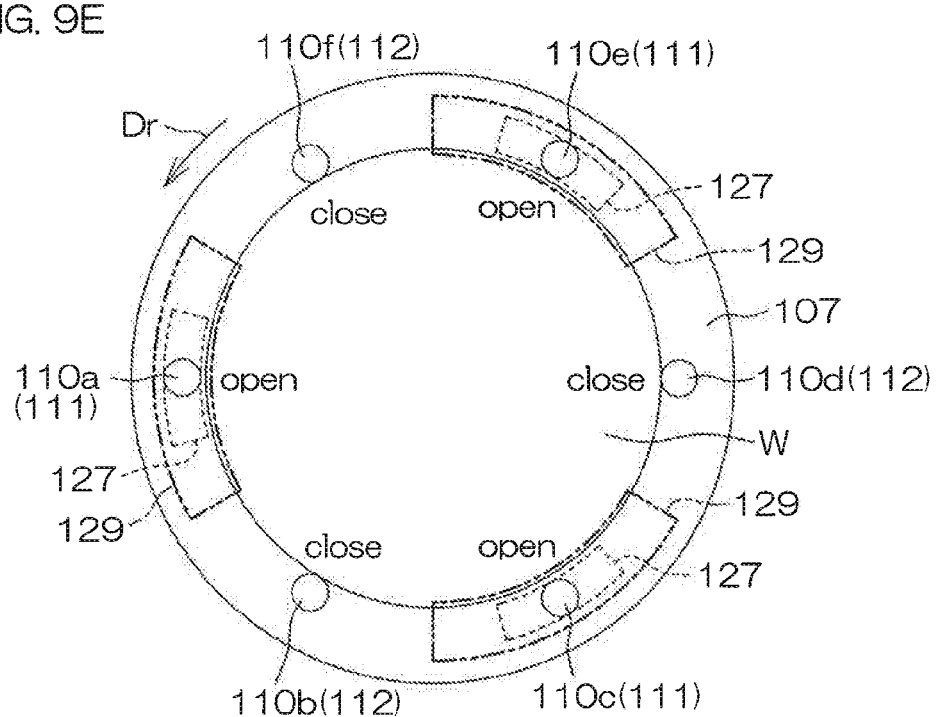

In the state of FIG. 9D, three movable pins 110b, 110d, and 110f included in the second movable pin group 112 and three opening permanent magnets 127 are placed in order in the circumferential direction of the rotary table 107. Therefore, three movable pins 110a, 110c, and 110e included in the first movable pin group 111 are each disposed at the intermediate position (open). On the other hand, the three movable pins 110a, 110c, and 110e included in the first movable pin group 111 are still disposed at the hold position (close) because corresponding three driving permanent magnets 156 (see FIG. 8C and so forth) do not exist in the magnetic field generation region 129. FIG. 9E shows a state in which the rotational phase of the rotary table 107 has further advanced in the rotation direction Dr from the state of FIG. 9D.

Figure 9F:
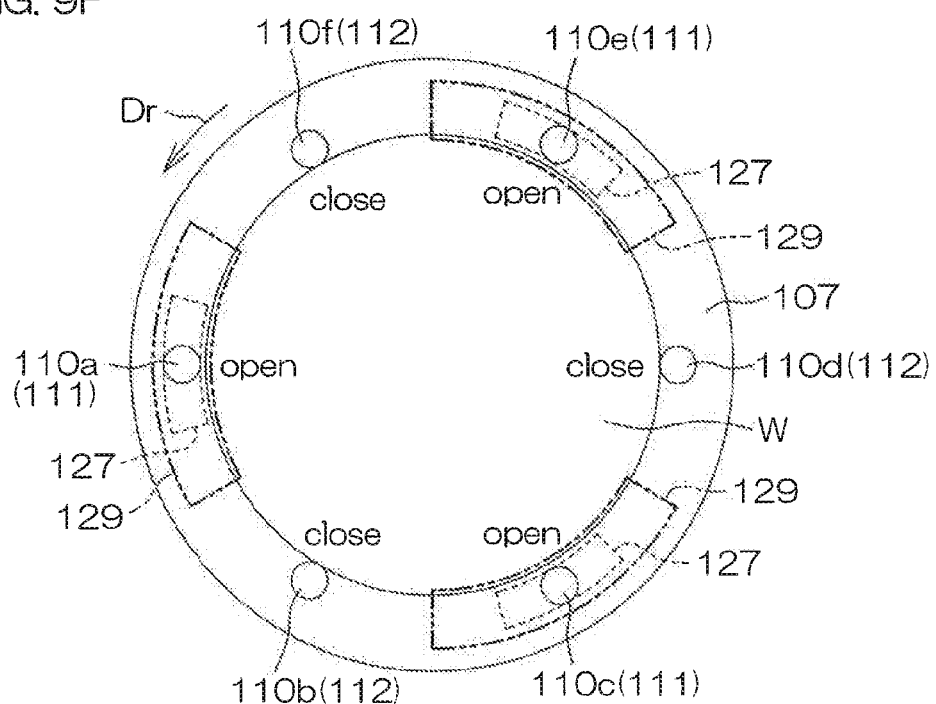

In the state of FIG. 9E, three movable pins 110b, 110d, and 110f included in the second movable pin group 112 each deviate outwardly from the magnetic field generation region 129. Therefore, these three movable pins 110b, 110d, and 110f included in the second movable pin group 112 are each disposed at the hold position (close). Instead, three movable pins 110a, 110c, and 110e included in the first movable pin group 111 enter the magnetic field generation region 129, and therefore these three movable pins 110a, 110c, and 110e included in the first movable pin group 111 are each disposed at the intermediate position (open). FIG. 9F shows a state in which the rotational phase of the rotary table 107 has further advanced in the rotation direction Dr from the state of FIG. 9E.

In the state of FIG. 9F, three movable pins 110a, 110c, and 110e included in the first movable pin group 111 each deviate outwardly from the magnetic field generation region 129. Therefore, these three movable pins 110a, 110c, and 110e included in the first movable pin group 111 are each disposed at the hold position (close). Instead, three movable pins 110b, 110d, and 110f included in the second movable pin group 112 enter the magnetic field generation region 129, and therefore these three movable pins 110b, 110d, and 110f included in the second movable pin group 112 are each disposed at the intermediate position (open). FIG. 9D shows a state in which the rotational phase of the rotary table 107 has further advanced in the rotation direction Dr from the state of FIG. 9C.

Figure 10:
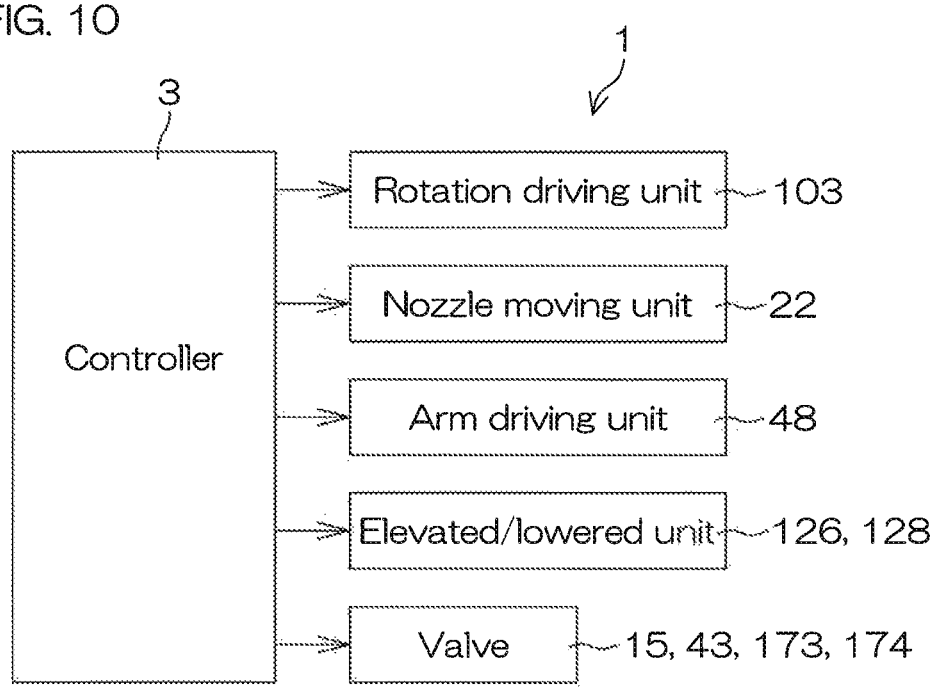
FIG. 10 is a block diagram to describe an electric arrangement of a main part of the substrate processing apparatus.

FIG. 10 is a block diagram to describe an electric arrangement of a main part of the substrate processing apparatus 1.

The controller 3 controls the operations of the rotation driving unit 103, the nozzle moving unit 22, the arm driving unit 48, the inner elevated/lowered unit 126, the outer elevated/lowered unit 128, etc., in accordance with a predetermined program. The controller 3 further controls the open-close operation etc., of the chemical liquid valve 15, the water valve 43, the inert gas valve 173, the inert gas flow control valve 174, etc.

Figure 11:
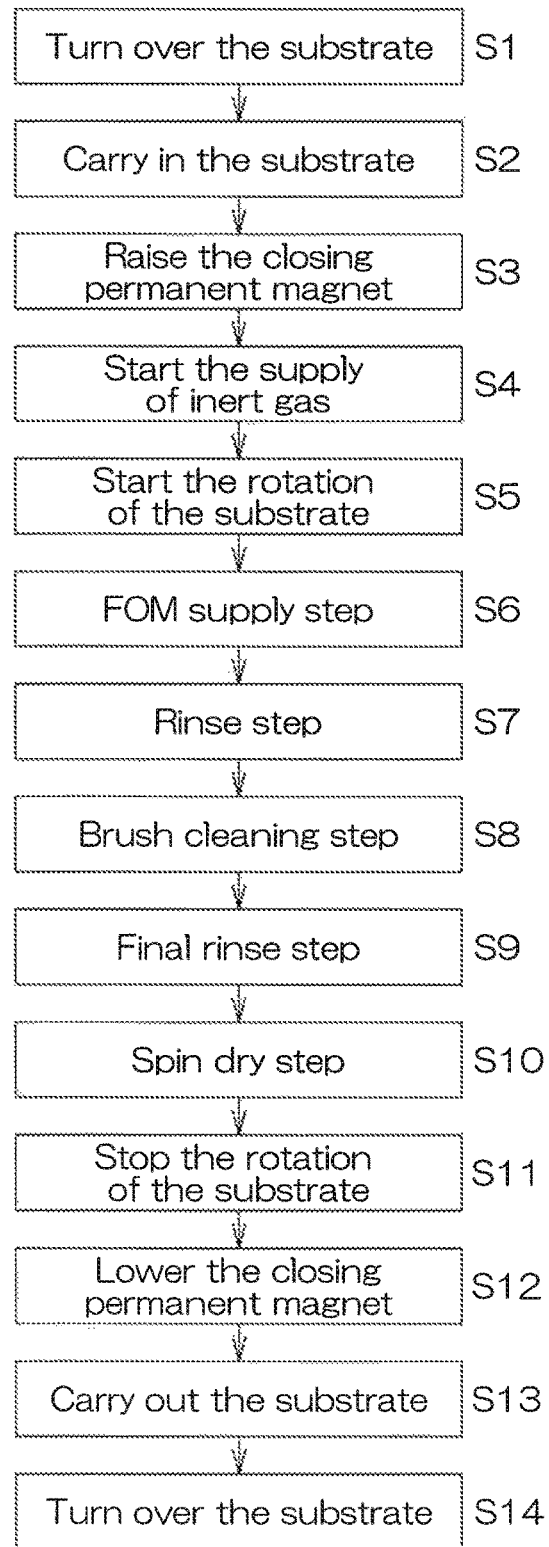
FIG. 11 is a flowchart to describe one example of processing liquid processing performed by the substrate processing apparatus.
Figure 12A:
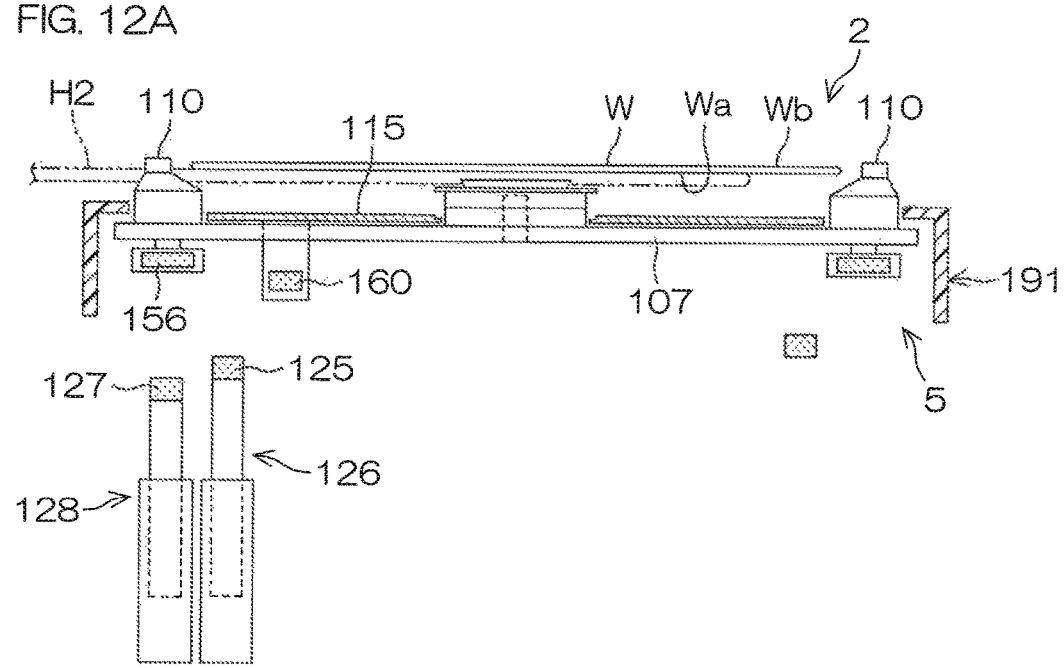
FIG. 12A to 12G are pictorial views each of which describes a treatment example of the processing liquid processing.
Figure 12B:
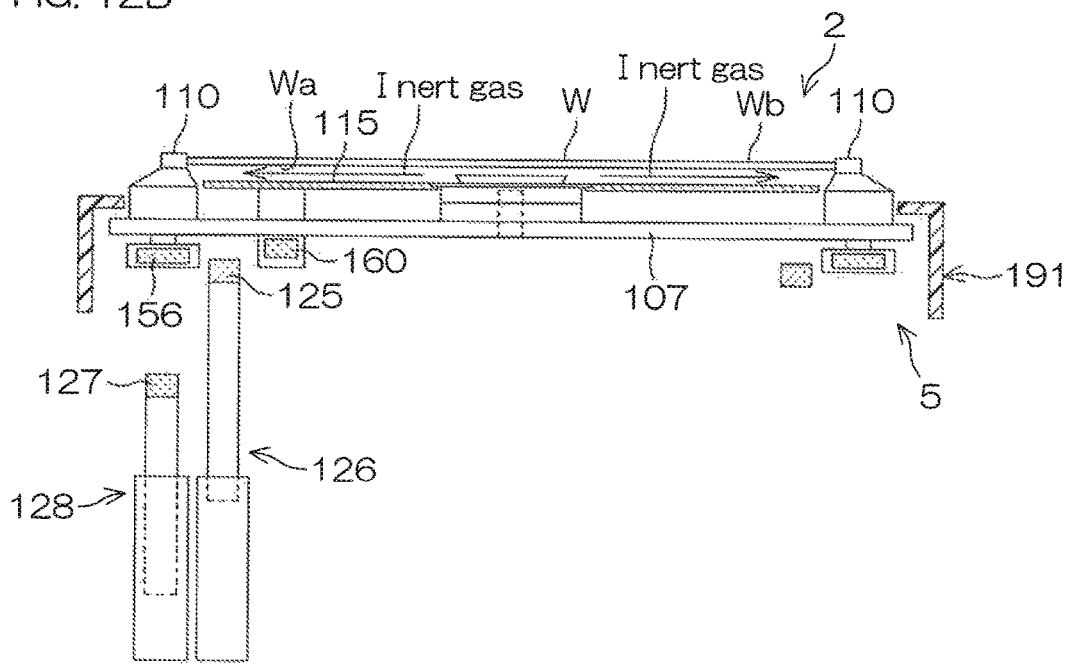

FIG. 11 is a flowchart to describe one example of cleaning that is processing liquid processing performed by the processing unit 2. FIG. 12A to 12G are pictorial views each of which describes a treatment example of the treatment. FIGS. 13A and 13B are views showing flow-around states of the processing liquid when the movable pin 110 is at the hold position and when the movable pin 110 is at the intermediate position, respectively. FIG. 13C is a cross-sectional view showing the flow of a processing liquid and the flow of an inert gas at the peripheral edge portion of a substrate W.

A description will be given with reference to FIG. 1, FIG. 2 to FIG. 7, and FIG. 11. Reference to FIG. 12A to 12G and FIG. 13A to 13C will be made appropriately.

The processing unit 2 uses a substrate W that has been processed by a preprocessing device, such as an annealer or a film formation device (hereinafter, referred to as a "not-yet-washed substrate" when necessary) as a substrate to be processed. A circular silicon substrate can be mentioned as one example of such a substrate W. The processing unit 2 washes, for example, a rear surface Wb (one major surface, a device non-forming surface) that is on the opposite side of a front surface Wa (one other major surface, a device forming surface) of a substrate W.

A carrier C in which a not-yet-washed substrate W is housed is conveyed from the preprocessing device to the substrate processing apparatus 1, and is placed on the load port LP. A substrate W is housed in the carrier C in a state in which the front surface Wa of the substrate W is directed upwardly. The controller 3 allows the indexer robot IR to convey the substrate W from the carrier C to the turnover unit TU in a state in which the front surface Wa is directed upwardly. Thereafter, the controller 3 allows the turnover unit TU to turn over the substrate W conveyed therefrom (S1: Turn over substrate). As a result, the rear surface Wb of the substrate W is directed upwardly. Thereafter, the controller 3 allows the hand H2 of the center robot CR to take the substrate W out of the turnover unit TU and to carry the substrate W into the processing unit 2 in a state in which the rear surface Wb is directed upwardly (step S2).

Prior to the carry-in of the substrate W, the chemical liquid nozzle 6 is withdrawn to the home position fixed beside the spin chuck 5. Similarly, the cleaning brush 10 is withdrawn to the home position fixed beside the spin chuck 5. The closing permanent magnet 125 and the opening permanent magnet 127 are each disposed at the lower position, and therefore the driving permanent magnet 156 does not receive an attractive magnetic force from the closing permanent magnet 125, and does not receive an attractive magnetic force from the opening permanent magnet 127. An external force does not act on each movable pin 110 except an elastic pressing force from the elastic pressing member (not shown), and therefore each movable pin 110 is placed at the open position as shown in FIG. 8A.

The closing permanent magnet 125 is disposed at the lower position, and hence is largely apart from the rotary table 107 downwardly, and therefore a repulsive magnetic force acting between the closing permanent magnet 125 and the protective-disk-side permanent magnet 160 is small. Therefore, the protective disk 115 is placed at the lower position closer to the upper surface of the rotary table 107. Therefore, a space wide enough for the hand H2 of the center robot CR to enter is secured between the substrate holding height by the movable pin 110 and the upper surface of the protective disk 115.

The hand H2 of the center robot CR conveys the substrate W to a space above the spin chuck 5 in a state in which the substrate W is held at a position higher than the upper end of the movable pin 110. Thereafter, the hand H2 of the center robot CR descends toward the upper surface of the rotary table 107 as shown in FIG. 12A. Thereafter, the controller 3 controls and allows the inner elevated/lowered unit 126 to raise the closing permanent magnet 125 (inner elevated/lowered magnet) to the upper position (opening magnet disposing step, step S3). As a result, as shown in FIG. 8B, each movable pin 110 is driven from the open position to the hold position, and is held at the hold position. Accordingly, the substrate W is grasped by six movable pins 110. The substrate W is held by the spin chuck 5 in a state in which its front surface Wa is directed downwardly and in which its rear surface Wb is directed upwardly.

Thereafter, the hand H2 of the center robot CR recedes toward the lateral part of the spin chuck 5 while passing through a space between the movable pins 110.

In a process in which the closing permanent magnet 125 rises to the upper position, the closing permanent magnet 125 approaches the protective-disk-side permanent magnet 160 from below, and the distance between these permanent magnets 125 and 160 is reduced, and, in accordance with this, a repulsive magnetic force acting therebetween is strengthened. This repulsive magnetic force floats the protective disk 115 from the upper surface of the rotary table 107 toward the substrate W. By the time when the closing permanent magnet 125 reaches the upper position, the protective disk 115 reaches the approach position at which an interval between the protective disk 115 and the front surface Wa (lower surface) of the substrate W is slight as shown in FIG. 12B, and the flange 120 formed at the lower end of the guide shaft 117 comes into contact with the linear bearing 118. As a result, the protective disk 115 is held at the approach position. In this state, the controller 3 opens the inert gas valve 173, and starts supplying an inert gas as shown in FIG. 12B (S4: start of inert gas supply). The inert gas supplied thereby is discharged from the upper end of the inert gas supply pipe 170, and is spouted in a radial manner centering on the rotational axis A1 toward a narrow space between the protective disk 115 placed at the approach position and the front surface Wa (lower surface) of the substrate W by means of the operations of the rectifying member 186 etc.

Figure 12C:
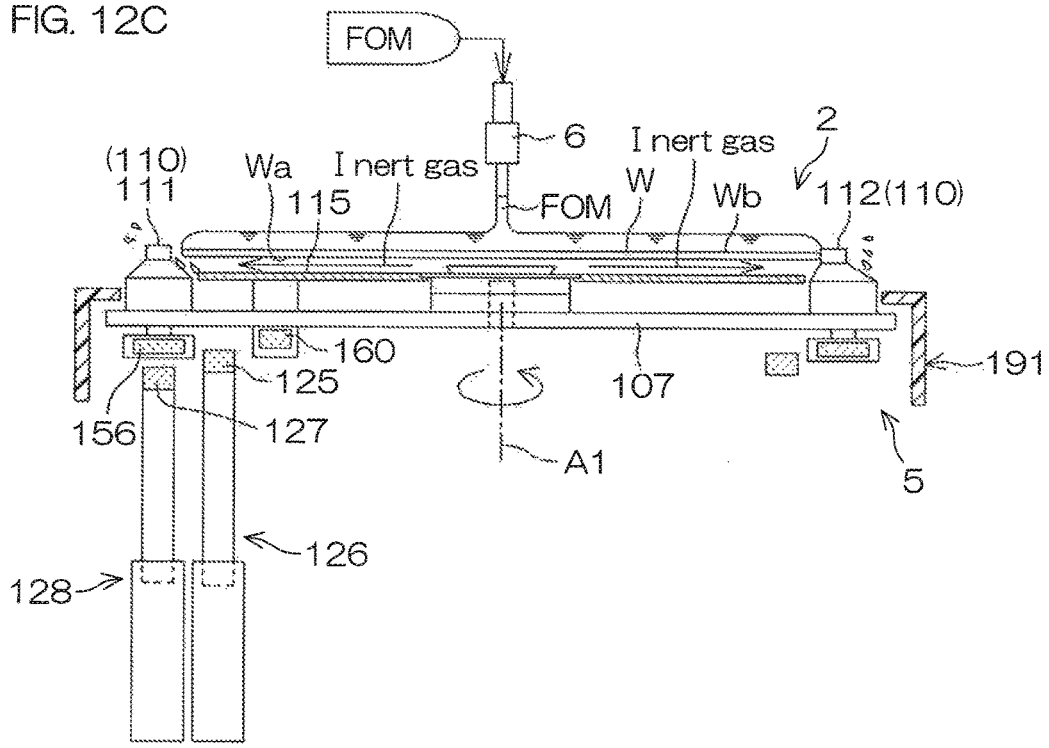
Figure 13A:
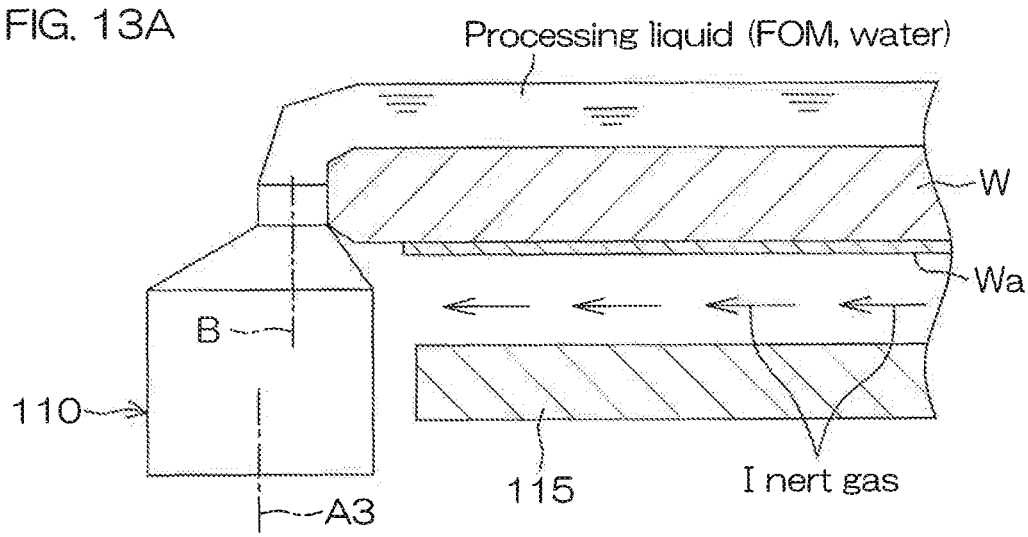
FIGS. 13A and 13B are views showing flow-around states of the processing liquid when the movable pin is at a hold position and when the movable pin is at an intermediate position, respectively.
Figure 13B:
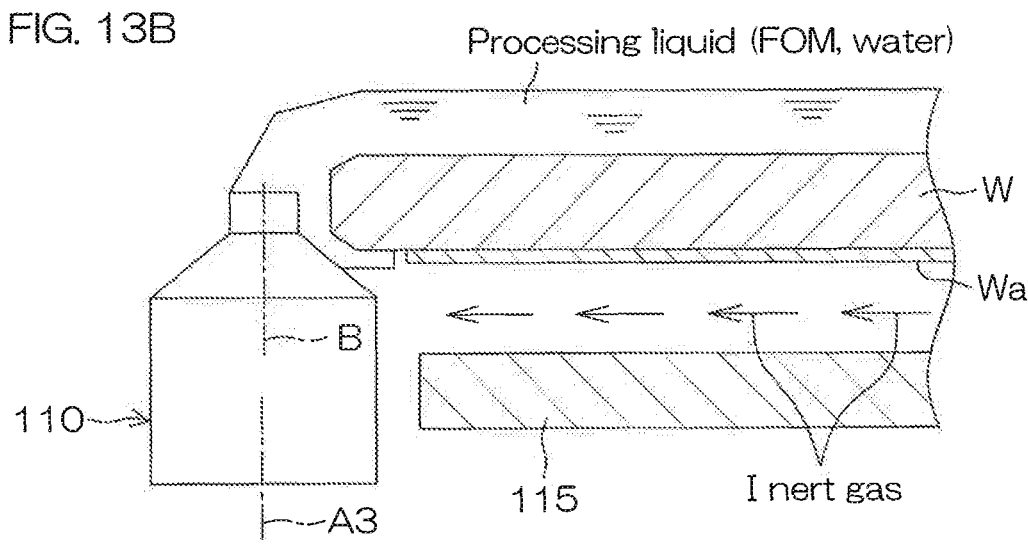
Figure 13C:
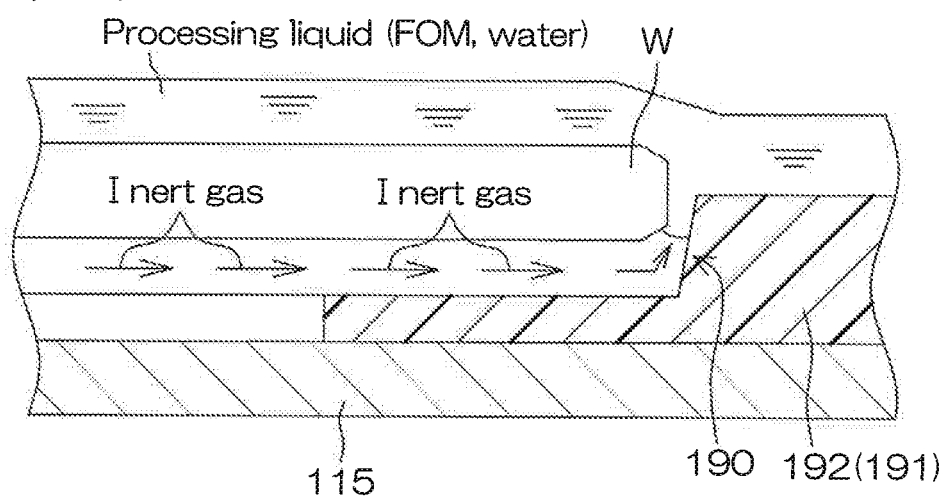
FIG. 13C is a cross-sectional view showing the flow of the processing liquid and the flow of an inert gas at the peripheral edge part of the substrate.

Thereafter, the controller 3 starts rotating the rotary table 107 while controlling the rotation driving unit 103 (rotary table rotation step), thereby rotating the substrate W around the rotational axis A1 as shown in FIG. 12C (step S5). The rotation speed of the substrate W is raised to a predetermined liquid processing speed (within a range of 300 to 1500 rpm, for example, 500 rpm), and is kept at this liquid processing speed.

After the rotation speed of the substrate W reaches the liquid processing speed, the controller 3 performs a FOM supplying step of supplying FOM to the rear surface Wb of the substrate W (processing liquid supply step, step S6). In the FOM supply step (S6), the controller 3 controls the nozzle moving unit 22, so that the chemical liquid nozzle 6 is moved from the home position to the central position. As a result, the chemical liquid nozzle 6 is disposed above the central part of the substrate W. After the chemical liquid nozzle 6 is disposed above the substrate W, the controller 3 opens the chemical liquid valve 15, so that FOM is discharged from the discharge port of the chemical liquid nozzle 6, and adheres to the central part of the rear surface Wb of the substrate W. FOM supplied to the central part of the rear surface Wb of the substrate W receives a centrifugal force by the rotation of the substrate W, and spreads radially toward the peripheral edge portion of the rear surface Wb of the substrate W. Therefore, it is possible to spread FOM over the whole area of the rear surface Wb of the substrate W.

In the FOM supply step (S6), a silicon oxide film is formed on the rear surface Wb of the substrate W that is a silicon substrate by the oxidation of ozone included in FOM. Additionally, scratches (missing parts, recesses, etc.) formed in the rear surface Wb of the substrate W are removed by the oxide-film-etching operation of hydrofluoric acid included in FOM, and foreign substances (particles, impurities, separation of the rear surface Wb of the substrate W, etc.) are also removed from the rear surface Wb of the substrate W.

In the FOM supply step (T6), an inert gas discharged from the upper end of the inert gas supply pipe 170 is spouted in a radial manner centering on the rotational axis A1 toward a narrow space between the protective disk 115 placed at the approach position and the front surface Wa (lower surface) of the substrate W by the operations of the rectifying member 186 etc. This inert gas is further accelerated by an orifice formed between a narrowing portion 190 formed at an annular plate portion 192 of a cover 191 disposed at the peripheral edge portion of the protective disk 115 and the peripheral edge portion of the substrate W as shown in FIG. 13C, and forms a high-speed spouting flow toward the lateral part of the substrate W. In the present preferred embodiment, an inert gas is supplied to the front surface Wa (lower surface) of the substrate W while using the protective disk 115, thus cleaning a peripheral edge region of the front surface Wa (lower surface) by allowing a processing liquid to flow around only the peripheral edge region (small range of about 1.0 mm from the peripheral end of the substrate W) of the front surface Wa (lower surface) of the substrate W, without completely preventing the processing liquid from flowing around the front surface Wa (lower surface) of the substrate W. The amount of processing liquid flowing therearound is controlled with high accuracy by forming a high-speed spouting flow. This amount of processing liquid flowing therearound depends on the supply flow rate of a processing liquid to the upper surface of the substrate W, depends on the supply flow rate of an inert gas to the lower surface of the substrate W, depends on the rotation speed of the substrate W, and so forth.

Figure 12D:
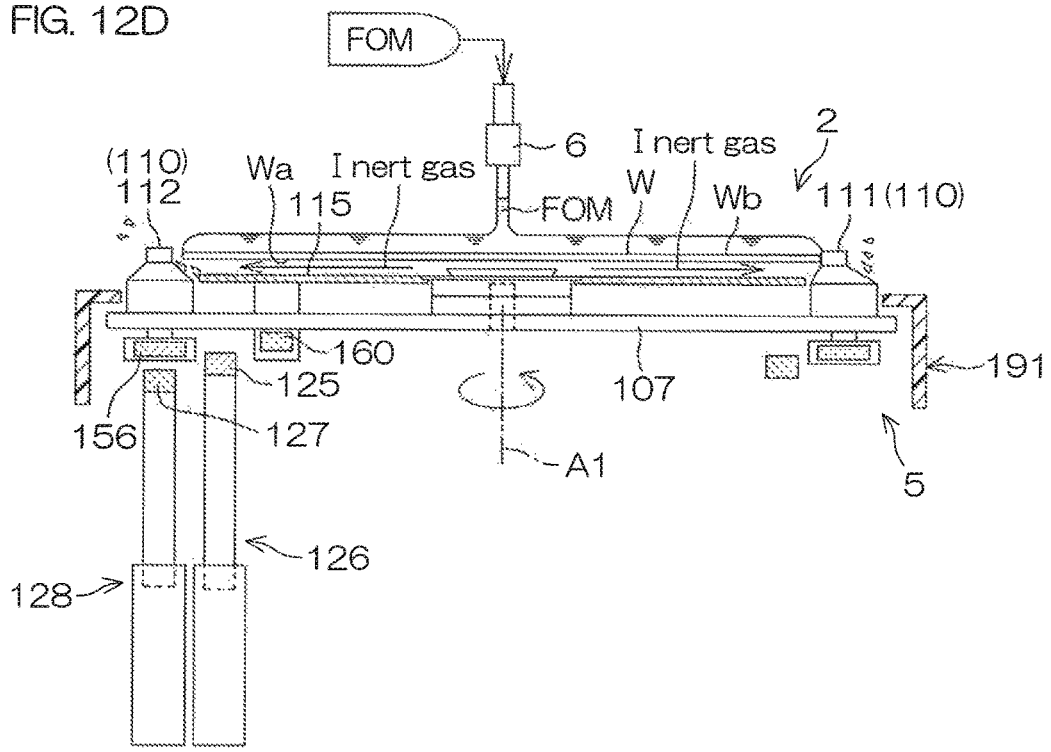

Furthermore, in the FOM supply step (S6), the controller 3 controllably allows the outer elevated/lowered unit 128 to raise the opening permanent magnet 127 from the lower position, at which the magnet has been held, to the upper position, and is held at the upper position. The controller 3 allows the opening permanent magnet 127 to be disposed at the upper position substantially at the same timing as the discharge of FOM from the chemical liquid nozzle 6. In a state in which the opening permanent magnet 127 is disposed at the upper position, three movable pins 110 among six movable pins 110 that correspond to three driving permanent magnets 156 simultaneously passing through the magnetic field generation region 129 are disposed at the intermediate position from the hold position. In response to a phase change of each movable pin 110 resulting from the rotation of the rotary table 107, the three movable pins 110 disposed at the intermediate position are switched between three movable pins 110 included in the first movable pin group 111 and three movable pins 110 included in the second movable pin group 112 as shown in FIGS. 12C and 12D. As a result, as shown in FIG. 9A to 9C, a transition is made between a state in which the substrate W is supported by the three movable pins 110 included in the first movable pin group 111 (see FIG. 9A and so forth) and a state in which the substrate W is supported by the three movable pins 110 included in the second movable pin group 112 (see FIG. 9C and so forth). In other words, it is possible to change the contact support position of the movable pin 110 at the peripheral edge portion of the substrate W in response to a change in the rotational phase of the rotary table 107.

An examination will be made of the flow-around of FOM in expected support positions (six positions in the circumferential direction) of the movable pins 110 in the substrate W. In a state in which the movable pin 110 is placed at the hold position, FOM supplied to the upper surface of the substrate W interferes with the upper shaft portion 152 being in contact with the peripheral end surface of the substrate W as shown in FIG. 13A. Therefore, in a state in which the movable pin 110 is placed at the hold position in expected support positions (six positions in the circumferential direction), it is impossible to allow FOM supplied to the upper surface of the substrate W to flow around the peripheral edge region of the lower surface of the substrate W by use of the peripheral end surface of the substrate W.

On the other hand, in a state in which the movable pin 110 is placed at the intermediate position, a predetermined gap (small gap) is formed with respect to the peripheral end surface of the substrate W as shown in FIG. 13B. It is possible to adjust this gap to a desired size by finely adjusting the location of the upper position of the opening permanent magnet 127 (i.e., an interval between the opening permanent magnet 127 and the driving permanent magnet 156). Through this gap, it is possible to allow FOM supplied to the upper surface of the substrate W to flow around the peripheral edge region of the lower surface of the substrate W by use of the peripheral end surface of the substrate W. For example, the gap is an order (small gap) of one tenth of several millimeters. In this case, the capillary force of FOM enables FOM to flow around the peripheral end surface of the substrate W and the peripheral edge region of the lower surface of the substrate W through the small gap.

When a predetermined period of time elapses from the start of FOM discharge, the FOM supply step (S6) is ended. In detail, the controller 3 closes the chemical liquid valve 15, and stops the discharge of FOM from the chemical liquid nozzle 6. Furthermore, the controller 3 moves the chemical liquid nozzle 6 from the central position to the home position. As a result, the chemical liquid nozzle 6 is withdrawn from above the substrate W.

Subsequently to the end of the FOM supply step (S6), water that is a rinse liquid starts being supplied to the rear surface Wb of the substrate W (S7: rinse step, processing liquid supply step).

Figure 12E:
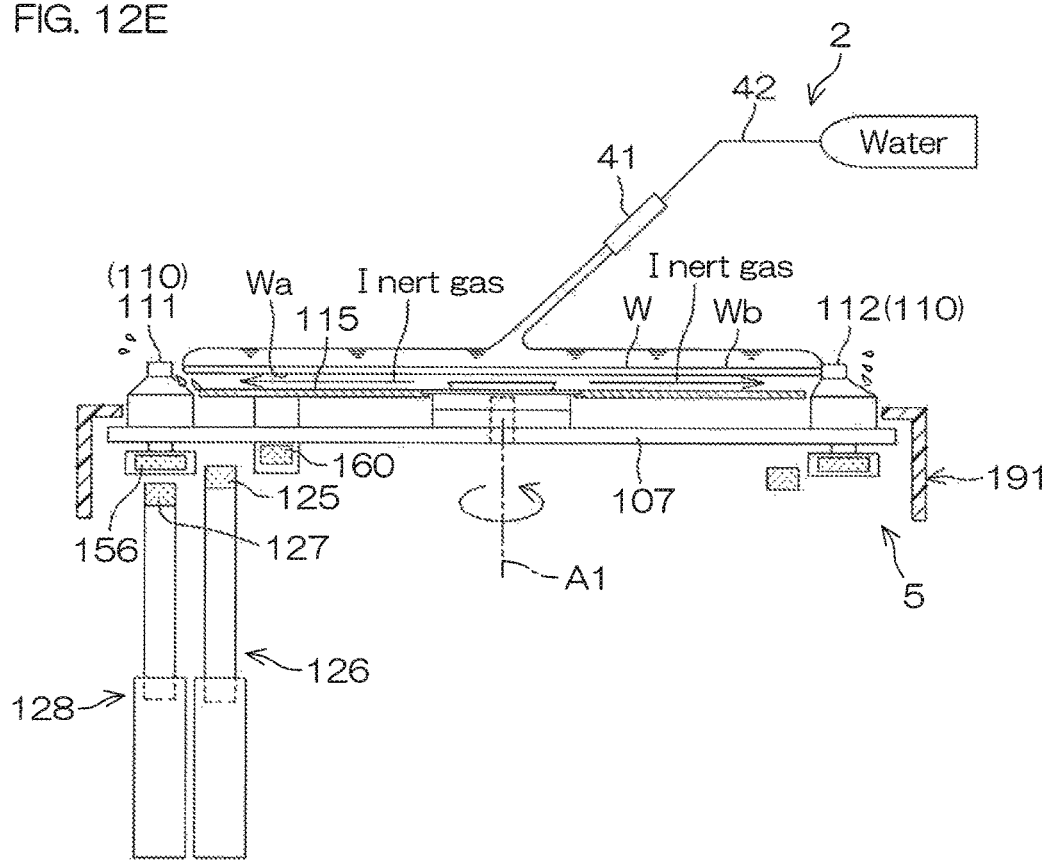

In detail, the controller 3 opens the water valve 43 and discharges water from the water nozzle 41 toward the central part of the rear surface Wb of the substrate W as shown in FIG. 12E. Water discharged from the water nozzle 41 adheres to the central part of the rear surface Wb of the substrate W covered with FOM. Water that has adhered to the central part of the rear surface Wb of the substrate W receives a centrifugal force resulting from the rotation of the substrate W, and flows on the rear surface Wb of the substrate W toward the peripheral edge portion of the substrate W, and spreads over the whole area of the rear surface Wb of the substrate W. Therefore, FOM on the substrate W is swept away outwardly by means of water, and is discharged around the substrate W. As a result, FOM adhering to the rear surface Wb of the substrate W is replaced with water.

Figure 12F:
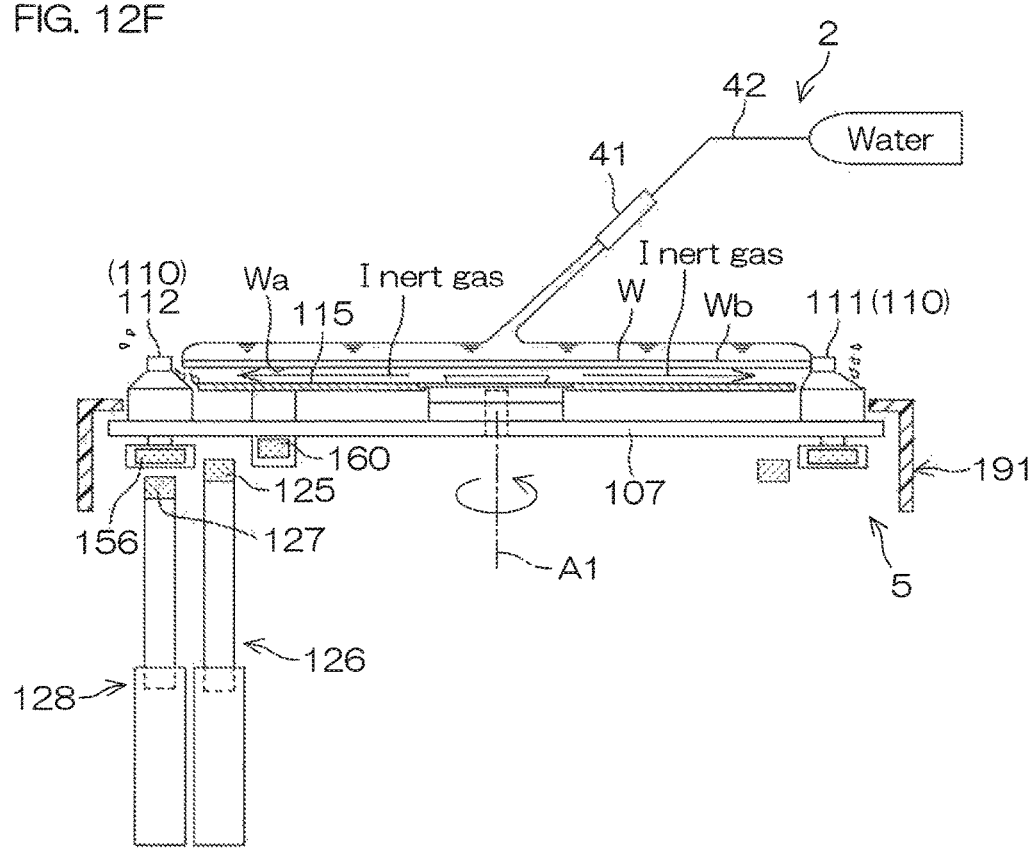

In the rinse step (S7), the opening permanent magnet 127 is held at the upper position. In a state in which the opening permanent magnet 127 is disposed at the upper position, three movable pins 110 among six movable pins 110 that correspond to three driving permanent magnets 156 simultaneously passing through the magnetic field generation region 129 are each disposed at the intermediate position from the hold position. In response to the phase change of each movable pin 110 resulting from the rotation of the rotary table 107, the three movable pins 110 disposed at the intermediate position are switched between three movable pins 110 included in the first movable pin group 111 and three movable pins 110 included in the second movable pin group 112 as shown in FIGS. 12E and 12F. As a result, as shown in FIG. 9A to 9C, a transition is made between a state (see FIG. 9A and so forth) in which the substrate W is supported by the three movable pins 110 included in the first movable pin group 111 and a state (see FIG. 9C and so forth) in which the substrate W is supported by the three movable pins 110 included in the second movable pin group 112. In other words, it is possible to change the support position of the substrate W by the movable pin 110 in response to a change in the rotational phase of the rotary table 107.

An examination will be made of the flow-around of FOM in support positions (six positions in the circumferential direction) of the movable pins 110 in the substrate W. In a state in which the movable pin 110 is placed at the hold position, FOM supplied to the upper surface of the substrate W interferes with the upper shaft portion 152 being in contact with the peripheral end surface of the substrate W as shown in FIG. 13A. Therefore, it is impossible to allow FOM supplied to the upper surface of the substrate W to flow around the peripheral edge region of the lower surface of the substrate W by use of the peripheral end surface of the substrate W.

On the other hand, in a state in which the movable pin 110 is placed at the intermediate position, a predetermined gap (small gap) is formed with respect to the peripheral end surface of the substrate W as shown in FIG. 13B. It is possible to adjust this gap to a desired size by finely adjusting the location of the upper position of the opening permanent magnet 127 (i.e., an interval between the opening permanent magnet 127 and the driving permanent magnet 156). Through this gap, it is possible to allow water supplied to the upper surface of the substrate W to flow around the peripheral edge region of the lower surface of the substrate W by use of the peripheral end surface of the substrate W. For example, the gap is an order (small gap) of one tenth of several millimeters. In this case, the capillary force of FOM enables FOM to flow around the peripheral end surface of the substrate W and the peripheral edge region of the lower surface of the substrate W through the small gap. This makes it possible to rinse away FOM that has adhered to the peripheral end surface of the substrate W or that has adhered to the peripheral edge region of the lower surface of the substrate W.

Figure 12G:
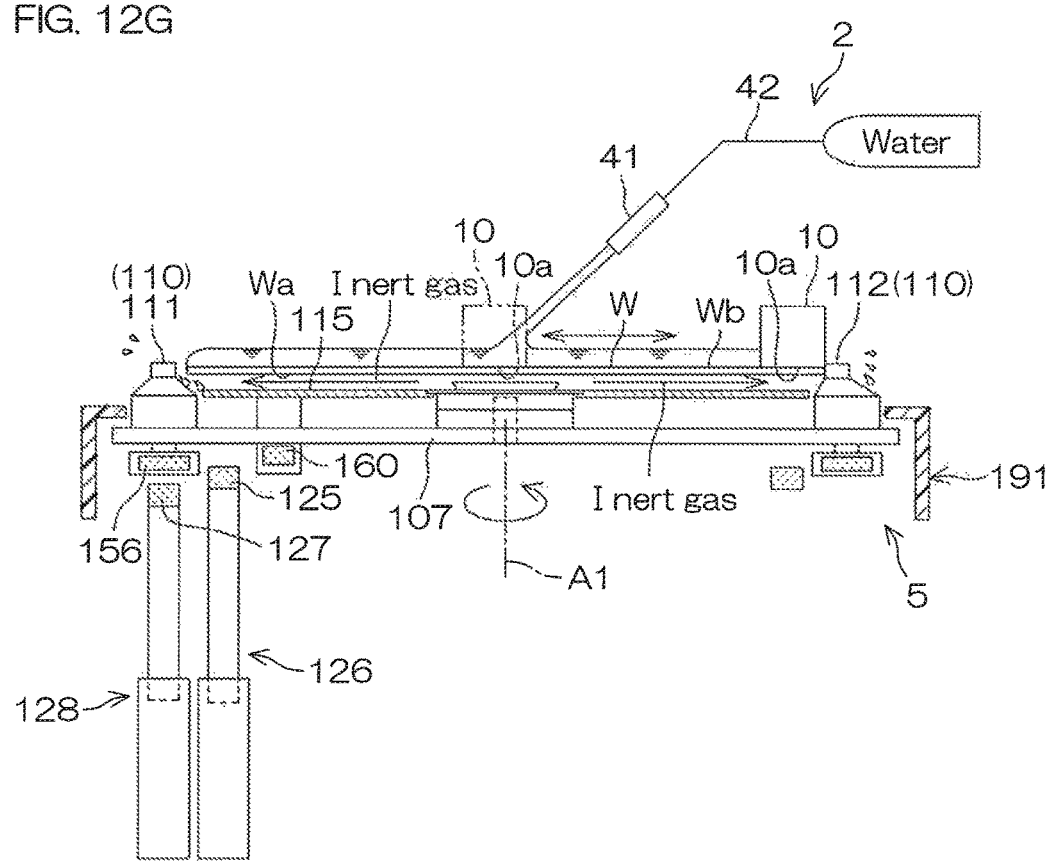

When a predetermined period of time elapses from the start of water discharge, the controller 3 controllably allows the arm driving unit 48 to perform scrub cleaning of the rear surface Wb of the substrate W by use of the cleaning brush 10 as shown in FIG. 12F (S8: brush cleaning step, processing liquid supply step). As a result, scrub cleaning is applied to the rear surface Wb of the substrate W by use of the cleaning brush 10 while supplying water. In detail, the controller 3 controllably allows the arm driving unit 48 to swing the swing arm 47 around the swing axis A2 so that the cleaning brush 10 is disposed above the substrate W from the home position and to press the cleaning surface 10a of the cleaning brush 10 against the rear surface Wb of the substrate W while lowering the cleaning brush 10. Thereafter, the controller 3 controllably allows the arm driving unit 48 to move (scan) the pressing position of the cleaning brush 10 between the central part of the substrate W and the peripheral edge portion of the substrate W as shown in FIG. 12G. As a result, the pressing position of the cleaning brush 10 scans the whole area of the rear surface Wb of the substrate W, and the whole area of the rear surface Wb of the substrate W is scrubbed by the cleaning brush 10. In the brush cleaning step (S8), foreign substances exfoliated in the FOM supply step (S6) are scratched off by a scrubbing operation by use of the cleaning brush 10. Thereafter, the foreign substances scratched off by the cleaning brush 10 are rinsed away by water. This makes it possible to remove exfoliated foreign substances from the rear surface Wb of the substrate W.

After the cleaning brush 10 moves and scrubs a plurality of times (for example, four times), the controller 3 controllably allows the arm driving unit 48 to return the cleaning brush 10 to the home position from above the spin chuck 5. The brush cleaning step (S8) is ended thereby. Furthermore, the controller 3 keeps the opening water valve 43 in a still open state. This allows water that is a rinse liquid to be supplied to the rear surface Wb of the substrate W, and foreign substances scratched by the cleaning brush 10 are discharged outwardly from the substrate W (S9: final rinse step, processing liquid supply step).

When a predetermined period of time elapses from the start of water supply, the controller 3 closes the water valve 43, and stops the discharge of water from the water nozzle 41. Furthermore, the controller 3 closes the inert gas valve 173, and stops the discharge of an inert gas from the inert gas supply pipe 170. Furthermore, the controller 3 controllably allows the outer elevated/lowered unit 128 to lower the opening permanent magnet 127 to the lower position. Subsequent to this, the substrate W is gripped by the six movable pins 110, and hence is firmly held.

Thereafter, a spin dry step (step S10) of drying the substrate W is performed. In detail, the controller 3 controllably allows the rotation driving unit 17 to accelerate the substrate W to a dry rotation speed (e.g., several thousand rpm) higher than the rotation speed from the FOM supply step (S6) to the final rinse step (S9) and to rotate the substrate W at this dry rotation speed. As a result, a large centrifugal force is applied to a liquid on the substrate W, and a liquid adhering to the substrate W is shaken off around the substrate W. The liquid is thus removed from the substrate W, and the substrate W becomes dry.

Thereafter, when a predetermined period of time elapses after the start of the high-speed rotation of the substrate W, the controller 3 controllably allows the rotation driving unit 17 to stop the rotation of the substrate W by the spin chuck 5 (step S11).

Thereafter, the controller 3 controllably allows the inner elevated/lowered unit 126 to lower the closing permanent magnet 125 to the lower position (step S12). As a result, the distance between the closing permanent magnet 125 and the protective-disk-side permanent magnet 160 becomes wide, and a magnetic repulsive force therebetween decreases. In response thereto, the protective disk 115 descends toward the upper surface of the rotary table 107. As a result, a space that the hand H2 of the center robot CR can satisfactorily enter is secured between the upper surface of the protective disk 115 and the front surface Wa (lower surface) of the substrate W. On the other hand, the closing permanent magnet 125 does not face the driving permanent magnet 156, and therefore an external force that urges the movable pin 110 to the hold position is lost, and the movable pin 110 is moved to the open position by receiving an elastic pressing force from the elastic pressing member (not shown). As a result, the substrate W is released from being grasped.

Thereafter, the substrate W is carried out from the inside of the processing chamber 4 (step S13). In detail, the controller 3 allows the hand H2 to enter the space secured between the protective disk 115 and the front surface Wa (lower surface) of the substrate W while controlling the center robot CR in a state in which all nozzles and so on recede from above the spin chuck 5. Thereafter, the hand H2 scoops out the substrate W held by the movable pin 110, and then recedes toward the lateral part of the spin chuck 5. As a result, the substrate W that has already been washed is carried out from the processing chamber 4.

The controller 3 allows the hand H2 of the center robot CR to convey the already-washed substrate W to the turnover unit TU. Thereafter, the controller 3 allows the turnover unit TU to turn over the substrate W conveyed thereby (step S14). As a result, the front surface Wa of the substrate W is directed upwardly. Thereafter, the controller 3 allows the hand H1 of the indexer robot IR to take out the substrate W from the turnover unit TU and to contain the already-washed substrate W in the carrier C in a state in which the front surface Wa thereof is directed upwardly. The already-washed substrate W is conveyed from the carrier C in which the substrate W is housed and from the substrate processing apparatus 1 toward a postprocessing device, such as an exposure device.

As described above, according to the present preferred embodiment, the opening permanent magnet 127 is disposed at the upper position in parallel with the rotation of the rotary table 107 and with the supply of a processing liquid (S6 to S9 of FIG. 11). In a state in which the opening permanent magnet 127 is disposed at the upper position, in response to a change in phase of each movable pin 110 resulting from the rotation of the rotary table 107, a transition is made between a state (see FIG. 9A and so forth) in which the substrate W is supported by three movable pins 110 included in the first movable pin group 111 and a state (see FIG. 9C and so forth) in which the substrate W is supported by three movable pins 110 included in the second movable pin group 112. In other words, in response to a change in rotational phase of the rotary table 107, it is possible to change the contact support position by the movable pin 110 in the substrate W. Therefore, it is possible to supply a processing liquid (FOM, water) to the whole area of the peripheral edge portion of the substrate W, and hence is possible to excellently process the peripheral edge portion of the substrate W by use of the processing liquid without the unfinished remainder of processing.

Although one preferred embodiment of the present invention has been described as above, the present invention can be carried out in other modes.

For example, with respect to the direction perpendicular to the rotational axis A3, the closing permanent magnet 125 is disposed on the inner side, and the opening permanent magnet 127 is disposed on the outer side, and yet these magnets may be turned over in arrangement position.

Additionally, although the polar direction of the opening permanent magnet 127 follows the up-down direction as described above, the polar direction of the opening permanent magnet 127 may be a direction perpendicular to the rotational axis A3 of the movable pin 110.

Additionally, although a function as a magnet to generate an attractive magnetic force between the closing permanent magnet 125 and the driving permanent magnet 156 and a function as a magnet to generate a repulsive magnetic force between the closing permanent magnet 125 and the protective-disk-side permanent magnet 160 are secured as described above, a magnet to generate a repulsive magnetic force between this magnet and the protective-disk-side permanent magnet 160 may be provided independently of the closing permanent magnet 125, and the closing permanent magnet 125 may be securely provided with a function as a magnet to generate an attractive magnetic force between the closing permanent magnet 125 and the driving permanent magnet 156.

In this case, the polar direction of the closing permanent magnet 125 is not necessarily required to be the up-down direction, and may be a direction perpendicular to the rotational axis A3 of the movable pin 110.

Additionally, although the magnetic field generation region 129 is disposed such that driving permanent magnets 156 (i.e., three driving permanent magnets 156) corresponding to three movable pins 110 simultaneously pass therethrough as described in the above preferred embodiment, it may be disposed such that driving permanent magnets 156 among six driving permanent magnets 156 in total that correspond to one or two movable pins 110 (i.e., one or two driving permanent magnets 156) simultaneously pass therethrough. In this case, the arrangement is formed not such that the substrate W is shifted between the first and second movable pin groups 111 and 112 each of which consists of three movable pins 110, but such that one or two movable pins 110 among six movable pins 110 are simultaneously disposed at the intermediate position, and this operation is successively performed with respect to the six movable pins 110.

Additionally, although the movable pin 110 is disposed at the intermediate position from the hold position by disposing the opening permanent magnet 127 at the upper position as described above, the movable pin 110 may remain at the hold position in a state in which the opening permanent magnet 127 is disposed at the upper position. However, in this case, it is possible to weaken the pressing force of the movable pin 110 (the upper shaft portion 152) against the peripheral end edge of the substrate W by means of an attractive magnetic force generated between the opening permanent magnet 127 and the driving permanent magnet 156. In other words, it is possible to adjust the pressing force (opening/closing force) of the movable pin 110 by disposing the opening permanent magnet 127 at the upper position although the movable pin 110 is not displaced. In this case, it is possible to more finely adjust the pressing force (opening/closing force) of the movable pin 110 by adjusting the upper position of the opening permanent magnet 127. In other words, it is possible to adjust not only a gap but also a subtle pressing force (gripping force).

Additionally, although the driving permanent magnet 156 is driven by an attractive magnetic force generated between the opening permanent magnet 127 and the driving permanent magnet 156 and by an attractive magnetic force generated between the closing permanent magnet 125 and the driving permanent magnet 156 as described above, the driving permanent magnet 156 may be driven by a repulsive magnetic force generated between the opening permanent magnet 127 and the driving permanent magnet 156 and/or by a repulsive magnetic force generated between the opening permanent magnet 127 and the driving permanent magnet 156.

Additionally, although the closing permanent magnet 125 is provided as an urging unit that urges the driving permanent magnet 156 to the hold position as described above, an elastic pressing unit, such as a spring, that urges the driving permanent magnet 156 to the hold position may be provided instead of the closing permanent magnet 125.

Additionally, although the number of movable pins 110 is set at six as described above, it can be set at six or more. In this case, if the number of movable pins 110 is an even number, it is possible to make the number of movable pins 110 included in the first movable pin group 111 and the number of movable pins 110 included in the second movable pin group 112 identical with each other, and therefore this is desirable from the viewpoint of layout. For example, if the number of movable pins 110 is set at eight, the number of movable pins included in each of the movable pin groups 111 and 112 becomes four, and, in this case, the number of opening permanent magnets 127 is also four that is the same as the number of movable pins 110. For example, although the surface to be processed is the rear surface Wb (device non-forming surface) of the substrate W as described above, the front surface Wa (device forming surface) of the substrate W may be used as a to-be-processed surface. In this case, it is also possible to eliminate the turnover unit TU.

Additionally, a series of steps of processing liquid processing may be performed to remove metals and to remove impurities buried in a film, without being limited to the removal of foreign substances. Additionally, a series of steps of processing liquid processing may be not cleaning but etching.

Although FOM is used as a chemical liquid as described in the above preferred embodiment, the chemical liquid to be supplied to the substrate W is a liquid including at least one among, for example, sulfuric acid, acetic acid, nitric acid, hydrochloric acid, hydrofluoric acid, aqueous ammonia, hydrogen peroxide water, organic acid (e.g., citric acid, oxalic acid), organic alkali (e.g., TMAH:
    tetramethylammonium hydroxide), organic solvent (e.g., IPA: isopropyl alcohol), surfactant, and corrosion inhibitor.

More preferably, DHF (dilution hydrofluoric acid), BHF (buffered hydrofluoric acid), SC1 (liquid that includes $NH_4OH$ and $H_2O_2$), FPM (liquid that includes HF and $H_2O_2$), etc., can be used as the chemical liquid to be supplied to the substrate W. In other words, a chemical liquid supply step of supplying a chemical liquid including one among the aforementioned chemical liquids to a to-be-processed surface of the substrate W can be performed instead of the FOM supply step (S6, T6), and DHF, BHF, SC1, FPM, etc., can be used as a chemical liquid used in this chemical liquid supply step. If these liquids are used as chemical liquids, the to-be-processed surface of the substrate W is not necessarily required to be bare silicon, and the to-be-processed surface of the substrate W may include an oxide film (for example, silicon oxide film) and/or a nitride film (for example, silicon nitride film).

Additionally, although the opening permanent magnet 127 is disposed at the upper position in the entire period of the chemical liquid step (S7 to S9) as described above, the opening permanent magnet 127 may be disposed at the upper position only in a partial period of the chemical liquid step (S7 to S9).

Additionally, although the opening permanent magnet 127 is disposed at the upper position in the entire period of the rinse step (S7 to S9) as described above, the opening permanent magnet 127 may be disposed at the upper position only in a partial period of the rinse step (S7 to S9).

Additionally, it is also possible to eliminate the brush cleaning step (S8) from the aforementioned processing liquid processing. In this case, there is no need to perform the final rinse step (S9), and therefore it is also possible to eliminate the rinse step (S9).

Additionally, although the to-be-processed surface is the upper surface of the substrate W as described above, the lower surface of the substrate W may be used as the to-be-processed surface. In this case, although a processing liquid is supplied to the lower surface of the substrate W, it is possible to excellently process the peripheral edge portion of the substrate W by use of the processing liquid without the unfinished remainder of processing if the processing liquid is allowed to flow around the upper surface of the substrate W from the lower surface of the substrate W at the substrate support position in the peripheral edge portion of the substrate W.

Additionally, although the substrate processing apparatus 1 is an apparatus that processes a disk-shaped semiconductor substrate as described above, the substrate processing apparatus 1 may be an apparatus that processes a polygonal substrate, such as a glass substrate for use in liquid crystal display devices.

Although the preferred embodiments of the present invention have been described in detail, these embodiments are merely concrete examples used to clarify the technical contents of the present invention, and the present invention should not be understood by being limited to these concrete examples, and the scope of the present invention is limited solely by the appended claims.

The present application corresponds to Japanese Patent Application No. 2015-192154 filed in the Japan Patent Office on Sep. 29, 2015 and Japanese Patent Application No. 2016-30155 filed in the Japan Patent Office on Feb. 19, 2016, and the entire disclosure of the applications is incorporated herein by reference.

What is claimed is:

1. A substrate holding/rotating device comprising:
   a rotary table;
   a rotation driving unit that rotates the rotary table around a rotational axis in a vertical direction;
   a plurality of movable pins each of which horizontally supports a substrate, the movable pin having a support portion disposed so as to be movable between an open position that is far apart from the rotational axis and a hold position that has approached the rotational axis, the movable pin disposed so as to rotate around the rotational axis together with the rotary table;
   an urging unit that urges the support portion of each movable pin to the hold position;
   driving magnets attached correspondingly to each movable pin; and
   an opening magnet disposed in a non-rotational state, the opening magnet generating a predetermined magnetic field generation region through which each movable pin rotating in response to rotation of the rotary table is capable of passing, the magnetic field generation region disposed so as to be eccentric with respect to a rotation direction of the rotary table and so as to allow only driving magnets corresponding to part of the plurality of movable pins to pass through the magnetic field generation region, the opening magnet giving a repulsive force or an attractive force to the driving magnet of the movable pin passing through the magnetic field generation region, the opening magnet generating a force that enables the support portion of the movable pin urged to the hold position by means of the urging unit to move toward the open position against an urging force of the urging unit.

2. The substrate holding/rotating device according to claim 1, further comprising a first relative movement unit that relatively moves the opening magnet and the rotary table so as to change a distance between the opening magnet and the driving magnet.

3. The substrate holding/rotating device according to claim 2, wherein the first relative movement unit relatively moves the opening magnet and the rotary table between a first position in which the magnetic field generation region is formed in a region through which each driving magnet passes and a second position in which the magnetic field generation region is not formed in a region through which each driving magnet passes.

4. The substrate holding/rotating device according to claim 3, wherein the support portion of the movable pin is disposed at an intermediate position between the open position and the hold position in a state in which the opening magnet and the rotary table are each at the first position.

5. The substrate holding/rotating device according to claim 1, wherein the urging unit includes a closing magnet that gives a repulsive force or an attractive force to a space between the closing magnet and each driving magnet and that urges the support portion of each movable pin to the hold position.

6. The substrate holding/rotating device according to claim 5, further comprising a second relative movement unit that relatively moves the closing magnet and the rotary table between a third position in which the closing magnet gives the repulsive force or the attractive force to a space between the closing magnet and the driving magnet and a fourth position in which the closing magnet does not give the repulsive force and the attractive force to a space between the closing magnet and the driving magnet.

7. The substrate holding/rotating device according to claim 1, wherein the opening magnet includes a plurality of opening magnets spaced out in a circumferential direction of the rotary table, and the magnetic field generation region formed in a region through which each driving magnet passes is an intermittent region in the rotation direction of the rotary table.

8. The substrate holding/rotating device according to claim 7, wherein the movable pins include a first movable pin group including at least three movable pins and a second movable pin group that is disposed independently of the first movable pin group and that includes at least three movable pins,
   the driving magnets provided correspondingly to all the movable pins are disposed to have mutually identical polar directions with respect to a direction perpendicular to an axis along the rotational axis, and
   the opening magnets are disposed so that each driving magnet corresponding to the second movable pin group is not present in the magnetic field generation region in a state in which each driving magnet corresponding to the first movable pin group is present in the magnetic field generation region, and are disposed so that each driving magnet corresponding to the first movable pin group is not present in the magnetic field generation region in a state in which each driving magnet corresponding to the second movable pin group is present in the magnetic field generation region.

9. The substrate holding/rotating device according to claim 8, wherein the first movable pin group includes the movable pins equal in number to the second movable pin group,
   the first movable pin group and the second movable pin group are disposed so that the first and second movable pin groups become alternate with respect to a circumferential direction of the rotary table and so that the movable pins included in each movable pin group are evenly spaced out, and the opening magnets that are equal in number to the movable pins included in each movable pin group are evenly spaced out in the circumferential direction of the rotary table.

10. The substrate holding/rotating device according to claim 7, wherein a rotation speed of the rotary table and/or a length in a circumferential direction of the opening magnet are provided so that the magnetic field generation region formed by the single opening magnet coincides with a disposition interval in the circumferential direction between the movable pins with respect to the circumferential direction of the rotary table.

11. The substrate holding/rotating device according to claim 1, further comprising a shielding member that shields interference between a magnetic field generated by the opening magnet and a magnetic field generated by the closing magnet.

12. A substrate processing apparatus comprising:
the substrate holding/rotating device according to claim 1; and
a processing liquid supplying unit that supplies a processing liquid to a major surface of a substrate held by the substrate holding/rotating device.

13. The substrate processing apparatus according to claim 12, further comprising:
a first relative movement unit that relatively moves the opening magnet and the rotary table between a first position in which the magnetic field generation region is formed in a region through which each driving magnet passes and a second position in which the magnetic field generation region is not formed in the region through which each driving magnet passes; and
a controller that controls the rotation driving unit, the processing liquid supplying unit, and the first relative movement unit,
the controller executing:
a rotary table rotation step of rotating the rotary table around the rotational axis;
a processing liquid supply step of supplying a processing liquid to a substrate rotating in response to rotation of the rotary table; and
an opening magnet disposing step of disposing relative positions of the opening magnet and the rotary table at the first position in parallel with the rotary table rotation step and with the processing liquid supply step.

14. A substrate processing method executed in a substrate processing apparatus, the substrate processing apparatus comprising:
a substrate holding/rotating device; and
a first relative movement unit,
the substrate holding/rotating device comprising:
a rotary table;
a rotation driving unit that rotates the rotary table around a rotational axis in a vertical direction;
a plurality of movable pins each of which horizontally supports a substrate, the movable pin having a support portion disposed so as to be movable between an open position that is far apart from the rotational axis and a hold position that has approached the rotational axis, the movable pin disposed so as to rotate around the rotational axis together with the rotary table;
an urging unit that urges the support portion of each movable pin to the hold position;
driving magnets attached correspondingly to each movable pin; and
an opening magnet disposed in a non-rotational state, the opening magnet forming a predetermined magnetic field generation region through which each movable pin rotating in response to rotation of the rotary table is capable of passing, the magnetic field generation region disposed so as to be eccentric with respect to a rotation direction of the rotary table and so as to allow only driving magnets corresponding to part of the plurality of movable pins to pass through the magnetic field generation region, the opening magnet giving a repulsive force or an attractive force to the driving magnet of the movable pin passing through the magnetic field generation region, the opening magnet generating a force that enables the support portion of the movable pin urged to the hold position by means of the urging unit to move toward the open position against an urging force of the urging unit,
the first relative movement unit relatively moving the opening magnet and the rotary table between a first position in which the magnetic field generation region is formed in a region through which each driving magnet passes and a second position in which the magnetic field generation region is not formed in a region through which each driving magnet passes,
the substrate processing method comprising:
a rotary table rotation step of rotating the rotary table around the rotational axis;
a processing liquid supply step of supplying a processing liquid to a substrate rotating in response to rotation of the rotary table; and
an opening magnet disposing step of disposing relative positions of the opening magnet and the rotary table at the first position in parallel with the rotary table rotation step and with the processing liquid supply step.

* * * * *